US009023689B1

(12) United States Patent
Minervini

(10) Patent No.: US 9,023,689 B1
(45) Date of Patent: May 5, 2015

(54) TOP PORT MULTI-PART SURFACE MOUNT MEMS MICROPHONE

(71) Applicant: Knowles Electronics, LLC, Itasca, IL (US)

(72) Inventor: Anthony D. Minervini, Palos Hills, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/149,501

(22) Filed: Jan. 7, 2014

Related U.S. Application Data

(60) Continuation of application No. 13/732,232, filed on Dec. 31, 2012, now Pat. No. 8,624,387, which is a continuation of application No. 13/286,558, filed on Nov. 1, 2011, now Pat. No. 8,358,004, which is a (Continued)

(51) Int. Cl.
*H01L 21/00* (2006.01)
*H04R 31/00* (2006.01)
(Continued)

(52) U.S. Cl.
CPC ............. *B81B 7/0061* (2013.01); *B81B 3/0021* (2013.01); *B81B 7/0058* (2013.01); *B81B 7/0064* (2013.01); *B81B 7/007* (2013.01); *H04R 19/016* (2013.01); *H04R 19/04* (2013.01); *B81B 2201/0257* (2013.01); *H01L 23/10* (2013.01); *H01L 2924/1461* (2013.01); *H04R 2225/49* (2013.01); *H04R 19/005* (2013.01)

(58) Field of Classification Search
CPC ....... H01L 23/10; H01L 31/006; H01L 21/78; B81B 2201/0257; B81B 7/0061; B81B 7/0064; B81B 3/0021; H04R 19/005; H04R 19/04; H04R 19/16; H04R 2225/49; H04R 19/016
See application file for complete search history.

(56) References Cited

U.S. PATENT DOCUMENTS 3,192,086 A 6/1965 Gyurk
3,567,844 A 3/1971 Krcmar
(Continued)

FOREIGN PATENT DOCUMENTS

CA 2315417 A1 2/2001
DE 10303263 8/2004
(Continued)

OTHER PUBLICATIONS

U.S. Appl. No. 60/209,692, filed Jun. 6, 2000, Carpenter.
(Continued)

*Primary Examiner* — Alonzo Chambliss
(74) *Attorney, Agent, or Firm* — Sughrue Mion, PLLC

(57) ABSTRACT

A top-port, surface mount package for a micro-electro-mechanical system (MEMS) microphone die is disclosed. The surface mount package features a substrate with metal pads for surface mounting the package to a device's printed circuit board and for making electrical connections between the microphone package and the device's circuit board. The surface mount microphone package has a sidewall spacer and a lid with an acoustic port, and the MEMS microphone die is lid-mounted and acoustically coupled to the acoustic port. The substrate, the sidewall spacer, and the lid are joined together to form the MEMS microphone, and the substrate, the sidewall spacer, and the lid cooperate to form an acoustic chamber for the lid-mounted MEMS microphone die.

43 Claims, 19 Drawing Sheets

Related U.S. Application Data continuation of application No. 13/111,537, filed on May 19, 2011, now Pat. No. 8,121,331, which is a continuation of application No. 11/741,881, filed on Apr. 30, 2007, now Pat. No. 8,018,049, which is a division of application No. 10/921,747, filed on Aug. 19, 2004, now Pat. No. 7,434,305, which is a continuation-in-part of application No. 09/886,854, filed on Jun. 21, 2001, now Pat. No. 7,166,910.

(60) Provisional application No. 60/253,543, filed on Nov. 28, 2000.

(51) Int. Cl.
*H04R 11/04* (2006.01)
*H01L 23/12* (2006.01)
*B81B 7/00* (2006.01)
*B81B 3/00* (2006.01)
*H04R 19/01* (2006.01)
*H04R 19/04* (2006.01)
*H01L 23/10* (2006.01)
*H04R 19/00* (2006.01)

(56) References Cited

U.S. PATENT DOCUMENTS

| | | |
|---|---|---|
| 3,735,209 A | 5/1973 | Saddler |
| 3,735,211 A | 5/1973 | Kapnias |
| 4,127,840 A | 11/1978 | House |
| 4,222,277 A | 9/1980 | Kurtz et al. |
| 4,277,814 A | 7/1981 | Giachino et al. |
| 4,314,226 A | 2/1982 | Oguro et al. |
| 4,456,796 A | 6/1984 | Nakagawa et al. |
| 4,533,795 A | 8/1985 | Baumhauer et al. |
| 4,558,184 A | 12/1985 | Busch-Vishniac et al. |
| 4,628,740 A | 12/1986 | Ueda et al. |
| 4,643,935 A | 2/1987 | McNeal et al. |
| 4,691,363 A | 9/1987 | Khanna |
| 4,737,742 A | 4/1988 | Takoshima et al. |
| 4,776,019 A | 10/1988 | Miyatake |
| 4,825,335 A | 4/1989 | Wilner |
| 4,891,686 A | 1/1990 | Krausse, III |
| 4,908,805 A | 3/1990 | Sprenkels et al. |
| 4,910,840 A | 3/1990 | Sprenkels et al. |
| 4,984,268 A | 1/1991 | Brown et al. |
| 5,099,396 A | 3/1992 | Barz et al. |
| 5,101,543 A | 4/1992 | Cote et al. |
| 5,101,665 A | 4/1992 | Mizuno |
| 5,146,435 A | 9/1992 | Bernstein |
| 5,151,763 A | 9/1992 | Marek et al. |
| 5,153,379 A | 10/1992 | Guzuk et al. |
| 5,159,537 A | 10/1992 | Okano |
| 5,178,015 A | 1/1993 | Loeppert et al. |
| 5,202,652 A | 4/1993 | Tabuchi et al. |
| 5,216,278 A | 6/1993 | Lin et al. |
| 5,237,235 A | 8/1993 | Cho et al. |
| 5,241,133 A | 8/1993 | Mullen, III et al. |
| 5,252,882 A | 10/1993 | Yatsuda |
| 5,257,547 A | 11/1993 | Boyer |
| 5,313,371 A | 5/1994 | Knecht et al. |
| 5,357,807 A | 10/1994 | Guckel et al. |
| 5,394,011 A | 2/1995 | Yamamoto et al. |
| 5,400,949 A | 3/1995 | Hirvonen et al. |
| 5,408,731 A | 4/1995 | Berggvist et al. |
| 5,449,909 A | 9/1995 | Kaiser et al. |
| 5,452,268 A | 9/1995 | Bernstein |
| 5,459,368 A | 10/1995 | Onishi et al. |
| 5,477,008 A | 12/1995 | Pasqualoni et al. |
| 5,490,220 A | 2/1996 | Loeppert |
| 5,506,919 A | 4/1996 | Roberts |
| 5,531,787 A | 7/1996 | Lesinski et al. |
| 5,545,912 A | 8/1996 | Ristic et al. |
| 5,592,391 A | 1/1997 | Muyshondt et al. |
| 5,593,926 A | 1/1997 | Fujihira |
| 5,611,129 A | 3/1997 | Yoshimoto et al. |
| 5,659,195 A | 8/1997 | Kaiser et al. |
| 5,712,523 A | 1/1998 | Nakashima et al. |
| 5,736,783 A | 4/1998 | Wein et al. |
| 5,740,261 A | 4/1998 | Loeppert et al. |
| 5,748,758 A | 5/1998 | Measco, Jr. et al. |
| 5,761,053 A | 6/1998 | King et al. |
| 5,776,798 A | 7/1998 | Quan et al. |
| 5,783,748 A | 7/1998 | Otani |
| 5,789,679 A | 8/1998 | Koshimizu et al. |
| 5,818,145 A | 10/1998 | Fukiharu |
| 5,831,262 A | 11/1998 | Greywall et al. |
| 5,838,551 A | 11/1998 | Chan |
| 5,852,320 A | 12/1998 | Ichihashi |
| 5,870,482 A | 2/1999 | Loeppert et al. |
| 5,886,876 A | 3/1999 | Yamaguchi |
| 5,889,872 A | 3/1999 | Sooriakumar et al. |
| 5,895,229 A | 4/1999 | Carney et al. |
| 5,898,574 A | 4/1999 | Tan et al. |
| 5,901,046 A | 5/1999 | Ohta et al. |
| 5,923,995 A | 7/1999 | Kao et al. |
| 5,939,784 A | 8/1999 | Glenn |
| 5,939,968 A | 8/1999 | Nguyen et al. |
| 5,949,305 A | 9/1999 | Shimamura |
| 5,976,912 A | 11/1999 | Fukutomi et al. |
| 5,977,626 A | 11/1999 | Wang et al. |
| 5,981,314 A | 11/1999 | Glenn et al. |
| 5,999,821 A | 12/1999 | Kaschke |
| 6,003,381 A | 12/1999 | Kato |
| 6,012,335 A | 1/2000 | Bashir et al. |
| 6,052,464 A | 4/2000 | Harris et al. |
| 6,066,882 A | 5/2000 | Kato |
| 6,078,245 A | 6/2000 | Fritz et al. |
| 6,088,463 A | 7/2000 | Rombach et al. |
| 6,093,972 A | 7/2000 | Carney et al. |
| 6,108,184 A | 8/2000 | Minervini et al. |
| 6,117,705 A | 9/2000 | Glenn et al. |
| 6,118,881 A | 9/2000 | Quinlan et al. |
| 6,119,920 A | 9/2000 | Guthrie et al. |
| 6,136,419 A | 10/2000 | Fasano et al. |
| 6,140,144 A | 10/2000 | Najafi et al. |
| 6,147,876 A | 11/2000 | Yamaguchi et al. |
| 6,150,748 A | 11/2000 | Fukiharu |
| 6,157,546 A | 12/2000 | Petty et al. |
| 6,163,071 A | 12/2000 | Yamamura |
| 6,178,249 B1 | 1/2001 | Hietanen et al. |
| 6,191,928 B1 | 2/2001 | Rector et al. |
| 6,201,876 B1 | 3/2001 | Niemi et al. |
| 6,228,676 B1 | 5/2001 | Glenn et al. |
| 6,242,802 B1 | 6/2001 | Miles et al. |
| 6,262,477 B1 | 7/2001 | Mahulikar et al. |
| 6,282,072 B1 | 8/2001 | Minervini et al. |
| 6,282,781 B1 | 9/2001 | Gotoh et al. |
| 6,308,398 B1 | 10/2001 | Beavers |
| 6,324,067 B1 | 11/2001 | Nishiyama |
| 6,324,907 B1 | 12/2001 | Halteren et al. |
| 6,339,365 B1 | 1/2002 | Kawase et al. |
| 6,352,195 B1 | 3/2002 | Guthrie et al. |
| 6,388,887 B1 | 5/2002 | Matsumoto et al. |
| 6,401,542 B1 | 6/2002 | Kato |
| 6,403,881 B1 | 6/2002 | Hughes |
| 6,404,100 B1 | 6/2002 | Chujo et al. |
| 6,428,650 B1 | 8/2002 | Chung |
| 6,437,412 B1 | 8/2002 | Higuchi et al. |
| 6,439,869 B1 | 8/2002 | Seng et al. |
| 6,441,503 B1 | 8/2002 | Webster |
| 6,472,724 B1 | 10/2002 | Matsuzawa et al. |
| 6,479,320 B1 | 11/2002 | Gooch |
| 6,483,037 B1 | 11/2002 | Moore et al. |
| 6,521,482 B1 | 2/2003 | Hyoudo et al. |
| 6,522,762 B1 | 2/2003 | Mullenborn et al. |
| 6,526,653 B1 | 3/2003 | Glenn et al. |
| 6,534,340 B1 | 3/2003 | Karpman et al. |
| 6,594,369 B1 | 7/2003 | Une |
| 6,621,392 B1 | 9/2003 | Volant et al. |
| 6,664,709 B2 | 12/2003 | Irie |
| 6,675,471 B1 | 1/2004 | Kimura et al. |
| 6,781,231 B2 | 8/2004 | Minervini |

(56) References Cited

U.S. PATENT DOCUMENTS

| | | | |
|---|---|---|---|
| 6,859,542 | B2 | 2/2005 | Johannsen et al. |
| 6,876,052 | B1 | 4/2005 | Tai |
| 6,928,718 | B2 | 8/2005 | Carpenter |
| 6,936,918 | B2 | 8/2005 | Harney et al. |
| 6,962,829 | B2 | 11/2005 | Glenn et al. |
| 7,003,127 | B1 | 2/2006 | Sjursen et al. |
| 7,080,442 | B2 | 7/2006 | Kawamura et al. |
| 7,092,539 | B2 | 8/2006 | Sheplak et al. |
| 7,142,682 | B2 | 11/2006 | Mullenborn et al. |
| 7,166,910 | B2 | 1/2007 | Minervini |
| 7,215,223 | B2 | 5/2007 | Hattanda et al. |
| 7,221,767 | B2 | 5/2007 | Mullenborn et al. |
| 7,242,089 | B2 | 7/2007 | Minervini |
| 7,280,855 | B2 | 10/2007 | Hawker et al. |
| 7,381,589 | B2 | 6/2008 | Minervini |
| 7,382,048 | B2 | 6/2008 | Minervini |
| 7,434,305 | B2 | 10/2008 | Minervini |
| 7,436,054 | B2 | 10/2008 | Zhe |
| 7,439,616 | B2 | 10/2008 | Minervini |
| 7,501,703 | B2 | 3/2009 | Minervini |
| 7,537,964 | B2 | 5/2009 | Minervini |
| RE40,781 | E | 6/2009 | Johannsen et al. |
| 7,927,927 | B2 | 4/2011 | Quan et al. |
| 8,018,049 | B2 | 9/2011 | Minervini |
| 8,103,025 | B2 | 1/2012 | Mullenborn et al. |
| 8,121,331 | B2 | 2/2012 | Minervini |
| 8,617,934 | B1 * | 12/2013 | Minervini ............ 438/125 |
| 8,623,709 | B1 * | 1/2014 | Minervini ............ 438/125 |
| 8,623,710 | B1 * | 1/2014 | Minervini ............ 438/125 |
| 8,624,384 | B1 * | 1/2014 | Minervini ............ 257/704 |
| 8,624,385 | B1 * | 1/2014 | Minervini ............ 257/704 |
| 8,624,386 | B1 * | 1/2014 | Minervini ............ 257/704 |
| 8,624,387 | B1 * | 1/2014 | Minervini ............ 257/704 |
| 8,629,005 | B1 * | 1/2014 | Minervini ............ 438/125 |
| 8,629,552 | B1 * | 1/2014 | Minervini ............ 257/704 |
| 8,633,064 | B1 * | 1/2014 | Minervini ............ 438/125 |
| 8,652,883 | B1 * | 2/2014 | Minervini ............ 438/125 |
| 2002/0067663 | A1 | 6/2002 | Loeppert et al. |
| 2002/0102004 | A1 | 8/2002 | Minervini |
| 2003/0052404 | A1 | 3/2003 | Thomas |
| 2003/0133588 | A1 | 7/2003 | Pedersen |
| 2004/0032705 | A1 | 2/2004 | Ma |
| 2004/0184632 | A1 | 9/2004 | Minervini |
| 2005/0018864 | A1 | 1/2005 | Minervini |
| 2005/0069164 | A1 | 3/2005 | Muthuswamy et al. |
| 2005/0185812 | A1 | 8/2005 | Minervini |
| 2005/0218488 | A1 | 10/2005 | Matsuo |
| 2006/0157841 | A1 | 7/2006 | Minervini |
| 2007/0189568 | A1 | 8/2007 | Wilk et al. |
| 2008/0247585 | A1 | 10/2008 | Leidl et al. |
| 2011/0096945 | A1 | 4/2011 | Furst et al. |

FOREIGN PATENT DOCUMENTS

| | | |
|---|---|---|
| EP | 0 077 615 A1 | 4/1983 |
| EP | 0 534 251 A1 | 3/1993 |
| EP | 0 682 408 A1 | 11/1995 |
| EP | 0 774 888 A2 | 5/1997 |
| FI | 981413 A | 12/1999 |
| JP | 63275926 | 11/1988 |
| JP | 01169333 | 7/1989 |
| JP | 07-099420 | 4/1995 |
| JP | 09-107192 | 4/1997 |
| JP | 09-306934 A | 11/1997 |
| JP | 09-318650 | 12/1997 |
| JP | 10-062282 A | 3/1998 |
| JP | 2000-165999 A | 6/2000 |
| JP | 2000-199725 A | 7/2000 |
| JP | 2000-277970 A | 10/2000 |
| JP | 2000-316042 | 11/2000 |
| JP | 2000-340687 A | 12/2000 |
| JP | 2001-102469 A | 4/2001 |
| JP | 2001-308217 A | 11/2001 |
| JP | 2002-324873 A | 11/2002 |
| JP | 2002-334951 A | 11/2002 |
| JP | 2005-235377 A | 9/2005 |
| JP | 2006-283561 A | 10/2006 |
| WO | 00/42636 A2 | 7/2000 |
| WO | 01/19133 A1 | 3/2001 |
| WO | 01/20948 A2 | 3/2001 |
| WO | 01/41497 A1 | 6/2001 |
| WO | 02/15636 A2 | 2/2002 |
| WO | 02/45463 A2 | 6/2002 |
| WO | 2006/020478 A1 | 2/2006 |
| WO | 2006/061058 A1 | 6/2006 |

OTHER PUBLICATIONS

U.S. Appl. No. 60/450,569, filed Feb. 28, 2003, Minervini.
U.S. Appl. No. 09/886,854, filed Jun. 21, 2001, Minervini.
U.S. Appl. No. 10/921,747, filed Aug. 19, 2004, Minervini.
U.S. Appl. No. 60/253,543, filed Nov. 29, 2000, Minervini.
U.S. Appl. No. 11/741,881, filed Apr. 30, 2007, Minervini.
Grieg, William, "Integrated Circuit Packaging, Assembly and Interconnections" (2007).
"Pressure Transducer Handbook," pp. 4-2 to 4-5, 12-1 to 12-5, National Semiconductor Corp., USA (1977).
Rosenberger, M.E., "Absolute Pressure Transducer for Turbo Application", pp. 77-79 (1983).
Smith, K., An Inexpensive High Frequency High Power VLSI Chip Carrier, IEPS.
Card, D., How ETA Chose to Make a Megaboard for its Supercomputer, pp. 50-52, Electron. Bus. (1988).
Speerschneider, C.F. et al., "Solder Bump Reflow Tape Automated Bonding", pp. 7-12, Proceedings 2nd ASM International Electronic Materials and Processing Congress (1989).
Tummala and Rymaszewski, "Microelectronics Packaging Handbook" (1989).
Minges, Merrill, L., "Electronics Materials Handbook, vol. 1 Packaging" (1989).
Pecht, Michael G., "Handbook of Electronic Package Design" (1991).
Petersen, Kurt et al., "Silicon Accelerometer Family; Manufactured for Automotive Applications" (1992).
Gilleo, Ken, "Handbook of Flexible Circuits" (1992).
Scheeper, P.R. et al., "A Review of Silicon Microphones", Sensor and Actuators Actuators, A 44, pp. 1-11 (1994).
Lau, John, ed., "Ball Grid Array Technology", McGraw Hill, Inc., USA (1995).
Khadpe, S., "Worldwide Activities in Flip Chip, BGA and TAB Technologies and Markets", pp. 290-293, Proceedings 1995 International Flip Chip, Ball Grid Array, TAB and Advanced Packaging Symposium (1995).
Alvarez, E. and Amkor Technology, Inc., "CABGA Optional Process Description" (Apr. 1997).
Dizon, C. and Amkor Technology, Inc., "CABGA Control Plan" (Dec. 1997).
Bever, T. et al., "BICMOS Compatible Silicon Microphone Packaged as Surface Mount Device", Sensors Expo (1999).
Torkkeli, Altti et al., "Capacitive Silicon Microphone," Physica Scripta vol. T79, pp. 275-278 (1999).
Pecht et al., "Electronic Packaging Materials and their Properties" (1999).
Premachandran, C.S. et al,, "Si-based Microphone Testing Methodology and Noise Reduction," Proceedings of SPIE, vol. 4019 (2000).
Torkkeli, Altti et al., "Capacitive microphone with low-stress polysilicon membrane and high-stress polysilicon backplate," Sensors and Actuators (2000).
"Harper, Charles ed., McGraw Hill, "Electronic Packaging and Interconnection Handbook" (2000)".
JEDEC Standard Terms, Definitions, and Letter Symbols for Microelectronic Devices (2000).
Institute of Electrical and Electronics Engineers, IEEE 100 The Authoritative Dictionary of IEEE Standards Terms Seventh Edition (2000).
Arnold, David Patrick, "A MEMS-Based Directional Acoustic Array for Aeoacoustic Measurements," Master's Thesis, University of Florida (2001).

(56) References Cited

OTHER PUBLICATIONS

Henning, Albert K. et al., "Microfluidic MEMS for Semiconductor Processing," IEEE Transaction on Components, Packaging, & Mfg. Tech., Part B, pp. 329-337, vol. 21, No. 4 (Nov. 1998).

Giasolli, Robert, "MEMS Packaging Introduction" (Nov. 2000).

Gale, Bruce K., "MEMS Packaging," Microsystems Principles (Oct. 2001).

Amkor Technology, Inc., "Control Plan—CABGA" (Apr. 2012).

Puttlitz & Totta, "Area Array Interconnection Handbook" (2001).

International Search Report for Application No. PCT/US05/021276 (Oct. 21, 2005).

European Search Report for Application No. 07702957.4 (Jul. 19, 2007).

Chung, K., et al., "Z-Axis Conductive Adhesives for Fine Pitch Interconnections", ISHM Proceedings, pp. 678-689 (1992).

Masuda, N., IEEE/CHMT Japan IEMT Symposium, pp. 55-58, (1989).

Kristiansen, H. et al., "Fine Pitch Connection of Flexible Circuits to Rigid Substrates Using Non-Conductive Epoxy Adhesive", IEPS, pp. 759-773 (1991).

Sakuma, K., et al., "Chip on Glass Technology with Standard Aluminized IC Chip", ISHM, pp. 250-256 (1990).

Katopis, G.A., "Delta-I Noise Specification for a High Performance Computing 'Machine'", Proc. IEEE, pp. 1405-1415 (1985).

Davis, E.M., et al., "Solid Logic Technology: Versatile High-Performance Microelectronics", IBM J. Res. Devel., 8(2), pp. 102-114 (1964).

Lloyd, R.H.F., "ASLT: An Extension of Hybrid- Miniaturization Techniques", IBM J. Res. Develop.,11(4), pp. 86-92 (1967).

Fox, P.E,. et al., "Design of Logic-Circuit Technology for IBM System 370 Models 145 and 155", IBM J. Res. Devel. 15(2), pp. 384-390 (1971).

Gedney, R.W., "Trends in Packaging Technology",16th Annual Proceedings of Reliability Physics, pp. 127-129 (1978).

Schwartz, B. et al., "Ceramics and the Micromodule", RCA Eng., 5(4), p. 56-58 (1960).

Lomeson, .R.B, "High Technology Microcircuit Packaging", International Electronic Packaging Society Proceedings, pp. 498-503 (1982).

Balde, J.W., "Status and Prospects of Surface Mount Technology", Solid State Technol., 29(6), pp. 99-103 (1986).

Lau, John, "Chip Scale Package Design, Materials, Process, Reliability, and Applications", McGraw-Hill(1999).

Notice of Investigation, Inv. No. 337-TA-629, in the Matter of "Certain Silicon Microphone Packages and Products Containing the Same", United States International Trade Commission, issued Jan. 3, 2008.

Arnold, David P. et al., "MEMS-Based Acoustic Array Technology," 40th AIAA Aerospace Sciences Meeting & Exhibit, Jan. 14-17, 2000, American Institute of Aeronautics and Astronautics, Reston, Virginia.

Kress, H.J. et al, "Integrated Silicon Pressure Sensor for Automotive Application with Electronic Trimming," SAE International, International Congress and Exposition, Detroit, Michigan (Feb. 27, 1995-Mar. 2, 1995).

Wiley Electrical and Electronics Engineering Dictionary, p. 275, IEEE Press (2004).

Initial Determination on Violation of Section 337 and Recommended Determination on Remedy and Bond, In the Matter of Certain Silicon Microphone Packages and Products Containing the Same, ITC Inv. No. 337-TA-695 (Nov. 22, 2010).

Notice of Commission Determination to Review in Part an Initial Determination, In the Matter of Certain Silicon Microphone Packages and Products Containing the Same, ITC Inv. No. 337-TA-695 (Jan. 21, 2011).

Initial Determination on Violation of Section 337 and Recommended Determination on Remedy and Bond, In the Matter of Certain Silicon Microphone Packages and Products Containing the Same, ITC Inv. No. 337-TA-629 (Jan. 12, 2009).

Commission Opinion, In the Matter of Certain Silicon Microphone Packages and Products Containing the Same, ITC Inv. No. 337-TA-629 (Aug. 18, 2009).

Federal Circuit Court of Appeals Opinion, *Mems Technology Berhad v International Trade Commission and Knowles Electronics LLC*, Case No. 2010-1018 (Jun. 3, 2011).

Initial Determination Terminating Investigation Based on Settlement Agreement, In the Matter of Certain Silicon Microphone Packages and Products Containing the Same, ITC Inv. No. 337-TA-825 (Mar. 12, 2013).

Joint Stipulation of Dismissal, *Knowles Electronics, LLC v. Analog Devices, Inc.*, United States District Court for the Northern District of Illinois, Civil Action No. 1:11-cv-06804 (Mar. 12, 2013).

Notification of Docket Entry, *Knowles Electronics, LLC v. Analog Devices, Inc.*, United States District Court for the Northern District of Illinois, Civil Action No. 1:11-cv-06804 (Mar. 13, 2013).

Notice of a Commission Determination Not to Review an Initial Determination Terminating Investigation Based on a Settlement Agreement; Termination of the Investigation, In the Matter of Certain Silicon Microphone Packages and Products Containing the Same, ITC Inv. No. 337-TA-825 (Apr. 8, 2013).

Corrected Conditional Rebuttal Expert Report of Wilmer Bottoms Regarding Validity, Public Version, In the Matter of Certain Silicon Microphone Packages and Products Containing the Same, ITC Inv. No. 337-TA-825 (Mar. 7, 2013).

Initial Post-Hearing Brief of Complainant Knowles Electronics, LLC, Public Version, In the Matter of Certain Silicon Microphone Packages and Products Containing the Same, ITC Inv. No. 337-TA-825 (Mar. 7, 2013).

Expert Report of Prof. Michael G. Pecht, Public Version, In the Matter of Certain Silicon Microphone Packages and Products Containing the Same, ITC Inv. No. 337-TA-825 (Mar. 7, 2013).

Initial Post-Hearing Brief of Respondents Analog Devices, Inc., Amkor Technology, Inc. & Avnet, Inc., Public Version, In the Matter of Certain Silicon Microphone Packages and Products Containing the Same, ITC Inv. No. 337-TA-825 (Mar. 7, 2013).

Reply Post-Hearing Brief of Respondents Analog Devices, Inc., Amkor Technology, Inc. & Avnet, Inc., Public Version, In the Matter of Certain Silicon Microphone Packages and Products Containing the Same, ITC Inv. No. 337-TA-825 (Mar. 7, 2013).

Opinion and Order, Motion for Reconsideration of the Court's Claim Construction Ruling, *Knowles Electronics, LLC v. Analog Devices, Inc.*, United States District Court for the Northern District of Illinois, Civil Action No. 1:11-cv-06804 (Feb. 19, 2013).

Rulings on Claim Construction, *Knowles Electronics, LLC v. Analog Devices, Inc.*, United States District Court for the Northern District of Illinois, Civil Action No. 1:11-cv-06804 (May 30, 2012).

Opinion and Order, Motion for Partial Summary Judgment, *Knowles Electronics, LLC v. Analog Devices, Inc.*, United States District Court for the Northern District of Illinois, Civil Action No. 1:11-cv-06804 (Mar. 7, 2013).

A. Dehe et al., *Silicon Micromachined Microphone Chip at Siemens*, 137th Regular Meeting of the Acoustical Society of America, Mar. 16, 1999, US.

A. J. Sprenkels, J.A. Voorthuryzen, and P. Bergveld, "A theoretical analysis of the electric airgap field-effect structure for sensors applications," 1986, US.

A.J. Sprenkels, W. Olthius, and P. Bergveld, "The application of silicon dioxide as an elecret materials", Proc. 6th Int. Symp. Electrets, ISE 6, p. 164-169, 1988, UK.

E.H. Pederson et al., "Flip-Chip Hermetic Packaging for MEMS", Proceedings of Eurosensors XIV, Copenhagen, Denmark, Aug. 27-30, 2000 US.

J.A. Voorthuyzen and P. Bergveld, "Semiconductor-based electret sensor for sound and pressure", IEEE Trans. Dielect. Elect. Insulation, 1989, p. 267-276.

J.A. Voorthuyzen and P. Bergveld, "The PRESSFET: An integrated electret-MOSFET based pressure sensor", Sens Actuators, 1988, p. 349-360.

Joint Electron Device Engineering Council, "JEDEC Standard, Descriptive Designation System for Semiconductor-Device Packages, JESD3O-B, Elec. Indus. Ass'n" Apr. 1995, US.

(56) References Cited

OTHER PUBLICATIONS

Kourosh Amiri Jam et al., "Design Methodology of Modular Microsystems", Mar. 29, 2001, Germany.

M. Schuenemann et al., "A highly flexible design and production framework for modularized microelectromechanical systems", Oct. 7, 1998, pp. 153-168.

Malshe et al., "Challenges in the Packaging of MEMS", 1999, p. 41-47, US.

Pecht et al., *Plastic-Encapsulated Microelectronics*, 1995, p. 460, US.

Prasad, Ray P., "Surface Mount Technology: Principles and Practices" 2nd Edition, 1997, p. 3-50, 129-135, 149-203, 339-597, 747-757, US.

Tummala, Rao R., "Microelectronics Packaging Handbook: Semiconductor Packaging Part II", 1997, pp. 1-42; Ch. 7 p. 11-3 to 11-128; Ch. 8.3 p. 11-136 to 11-185; Ch. 9 p. 11-284 to 11-393; Section 11.5 p. 11-516 to 11-527; Section 11.6 p. 11-528 to 11-533; Ch. 14 p. 11-873 to 11-927; Glossary pp. 11-931 to 11-976, USA.

Tummala, Rao R., "Fundamentals of Microsystems Packaging", 2001, p. 2-42, 65-68, 81-119, 120-183, 265-294, 297-340, 543-578, 580-610, 659-693, 695-747, 678-682, 924-944, US.

Respondents' Notice of Prior Art, In the Matter of Certain Silicon Microphone Packages and Products Containing the Same, ITC Inv. No. 337-TA-888 (Oct. 23, 2013).

Construing Terms of Asserted Claims of Patents at Issue & Denying Complainants' Motion to Supplement Its Proposed Claim Constructions, Inv. No. 337-TA-888, U.S. Intl Trade Commission, Apr. 15, 2014.

Respondents Goertek, Inc.'s, and Goertek Electronics, Inc.'s Petition for Review of Initial and Recommended Determinations, Inv. No. 337-TA-888, U.S. Int'l Trade Commission, Sep. 17, 2014.

Respondents Goertek, Inc.'s, and Goertek Electronics, Inc.'s Response to Complainant Knowles Electronics LLC's Contingent Petition for Review of Final Initial Determination, Inv. No. 337-Ta-888, U.S. Int'l Trade Commission, Sep. 29, 2014.

Complainant Knowles Electronics, LLC's Contingent Petition for Review of Final Initial Determination, Inv. No. 337-TA-888, U.S. Int'l Trade Commission, Sep. 17, 2014.

Complainant Knowles Electronics, LLC's Response To Petition For Review Of Respondents Goertek Inc. And Goertek Electronics, Inc., Inv. No. 337-TA-888, U.S. Int'l Trade Commission, Sep. 29, 2014.

Complainant Knowles Electronics, LLC's Statement On The Public Interest Pursuant To 19 C.F.R. § 210.50(a)(4), Inv. No. 337-TA-888, U.S. Int'l Trade Commission, Oct. 2, 2014.

Reply Post-Hearing Brief of Complainant Knowles Electronics, LLC, Public Version, In the Matter of Certain Silicon Microphone Packages and Products Containing the Same, ITC Inv. No. 337-TA-825 (Mar. 7, 2013).

Summary Of Complainant Knowles Electronics, LLC's Response To Petition For Review Of Respondents Goertek Inc. And Goertek Electronics, Inc., Inv. No. 337-TA-888, U.S. Int'l Trade Commission, Sep. 29, 2014.

Notice Regarding Issuance Of Public Version Of Final Initial Determination And Recommended Determination On Remedy And Bond, Inv. No. 337-TA-888, U.S. Int'l Trade Commission, Oct. 15, 2014.

\* cited by examiner

TOP PORT MULTI-PART SURFACE MOUNT MEMS MICROPHONE

RELATED APPLICATIONS

This application is a continuation of U.S. patent application Ser. No. 13/732,232 (now U.S. Pat. No. 8,624,387), filed Dec. 31, 2012, which is a continuation of U.S. patent application Ser. No. 13/286,558 (now U.S. Pat. No. 8,358,004), filed Nov. 1, 2011, which is a continuation of U.S. patent application Ser. No. 13/111,537 (now U.S. Pat. No. 8,121,331), filed May 19, 2011, which is a continuation of U.S. patent application Ser. No. 11/741,881 (now U.S. Pat. No. 8,018,049), filed Apr. 30, 2007, which is a divisional of U.S. patent application Ser. No. 10/921,747 (now U.S. Pat. No. 7,434,305), filed Aug. 19, 2004, which is a continuation-in-part of U.S. patent application Ser. No. 09/886,854 (now U.S. Pat. No. 7,166,910), filed Jun. 21, 2001, which claims the benefit of U.S. Provisional Patent Application No. 60/253,543, filed Nov. 28, 2000. U.S. patent application Ser. No. 13/668,035, filed Nov. 2, 2012, U.S. patent application Ser. No. 13/668,103, filed Nov. 2, 2012, U.S. patent application Ser. No. 13/732,120, filed Dec. 31, 2012, U.S. patent application Ser. No. 13/732,179, filed Dec. 31, 2012, U.S. patent application Ser. No. 13/732,205, filed Dec. 31, 2012, and U.S. patent application Ser. No. 13/732,232, filed Dec. 31, 2012, are also continuations of U.S. patent application Ser. No. 13/286,558 (now U.S. Pat. No. 8,358,004). These applications are hereby incorporated by reference herein in their entireties for all purposes.

TECHNICAL FIELD

This patent relates generally to a housing for a transducer. More particularly, this patent relates to a silicon condenser microphone including a housing for shielding a transducer.

BACKGROUND OF THE INVENTION

There have been a number of disclosures related to building microphone elements on the surface of a silicon die. Certain of these disclosures have come in connection with the hearing aid field for the purpose of reducing the size of the hearing aid unit. While these disclosures have reduced the size of the hearing aid, they have not disclosed how to protect the transducer from outside interferences. For instance, transducers of this type are fragile and susceptible to physical damage. Furthermore, they must be protected from light and electromagnetic interferences. Moreover, they require an acoustic pressure reference to function properly. For these reasons, the silicon die must be shielded.

Some shielding practices have been used to house these devices. For instance, insulated metal cans or discs have been provided. Additionally, DIPs and small outline integrated circuit (SOIC) packages have been utilized. However, the drawbacks associated with manufacturing these housings, such as lead time, cost, and tooling, make these options undesirable.

SUMMARY OF THE INVENTION

The present invention is directed to a silicon condenser microphone package that allows acoustic energy to contact a transducer disposed within a housing. The housing provides the necessary pressure reference while at the same time protects the transducer from light, electromagnetic interference, and physical damage. In accordance with an embodiment of the invention a silicon condenser microphone includes a transducer and a substrate and a cover forming the housing. The substrate may have an upper surface with a recess formed therein allowing the transducer to be attached to the upper surface and to overlap at least a portion of the recess thus forming a back volume. The cover is placed over the transducer and includes an aperture adapted for allowing sound waves to reach the transducer.

Other features and advantages of the invention will be apparent from the following specification taken in conjunction with the following drawings.

BRIEF DESCRIPTION OF THE DRAWINGS

FIG. 14b is a plan view of a layer of the laminated bottom portion of FIG. 14a;

FIG. 14c is a plan view of a layer of the laminated bottom portion of FIG. 14a;

FIG. 14d is a plan view of a layer of the laminated bottom portion of FIG. 14a;

DETAILED DESCRIPTION

Figure 1:
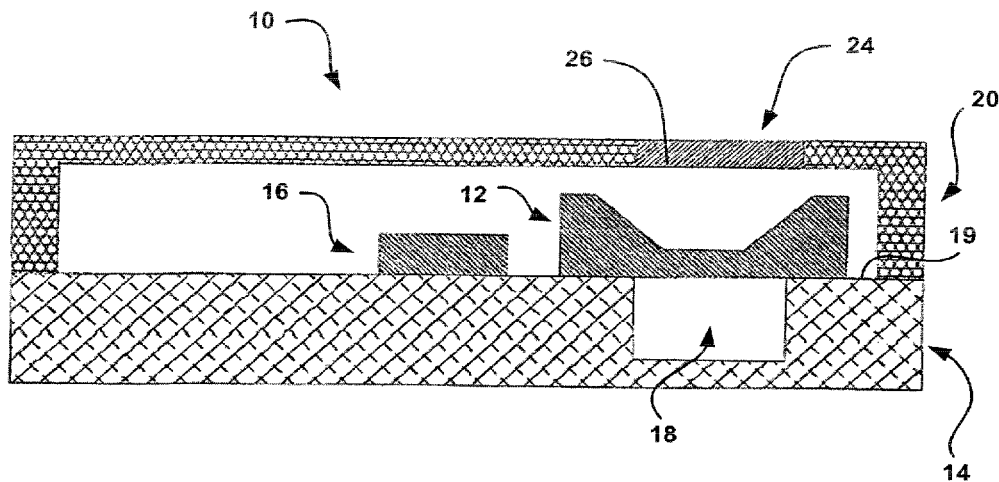
FIG. 1 is a cross-sectional view of a first embodiment of a silicon condenser microphone of the present invention.

While the invention is susceptible of embodiments in many different forms, there is shown in the drawings and will herein be described in detail several possible embodiments of the invention with the understanding that the present disclosure is to be considered as an exemplification of the principles of the invention and is not intended to limit the broad aspect of the invention to the embodiments illustrated.

The present invention is directed to microphone packages. The benefits of the microphone packages disclosed herein over microphone packaging utilizing plastic body/lead frames include the ability to process packages in panel form allowing more units to be formed per operation and at much lower cost. The typical lead frame for a similarly functioning package would contain between 40 and 100 devices connected together. The present disclosure would have approximately 14,000 devices connected together (as a panel). Also, the embodiments disclosed herein require minimal "hard-tooling" This allows the process to adjust to custom layout requirements without having to redesign mold, lead frame, and trim/form tooling.

Moreover, many of the described embodiments have a better match of thermal coefficients of expansion with the end user's PCB, typically made of FR-4, since the microphone package is also made primarily of FR-4. These embodiments of the invention may also eliminate the need for wire bonding that is required in plastic body/lead frame packages. The footprint is typically smaller than that would be required for a plastic body/lead frame design since the leads may be formed by plating a through-hole in a circuit board to form the pathway to the solder pad. In a typical plastic body/lead frame design, a (gull wing configuration would be used in which the leads widen the overall foot print.

Figure 2:
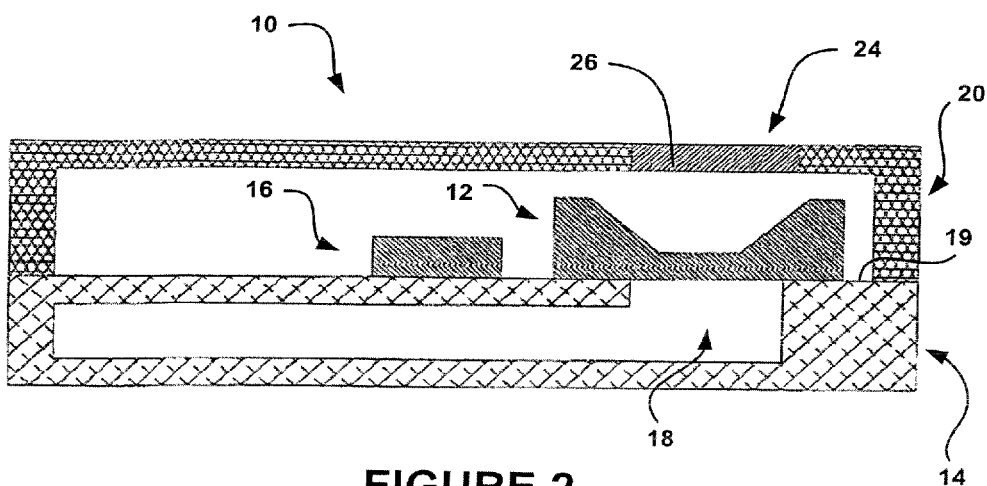
FIG. 2 is a cross-sectional view of a second embodiment of a silicon condenser microphone of the present invention.
Figure 3:
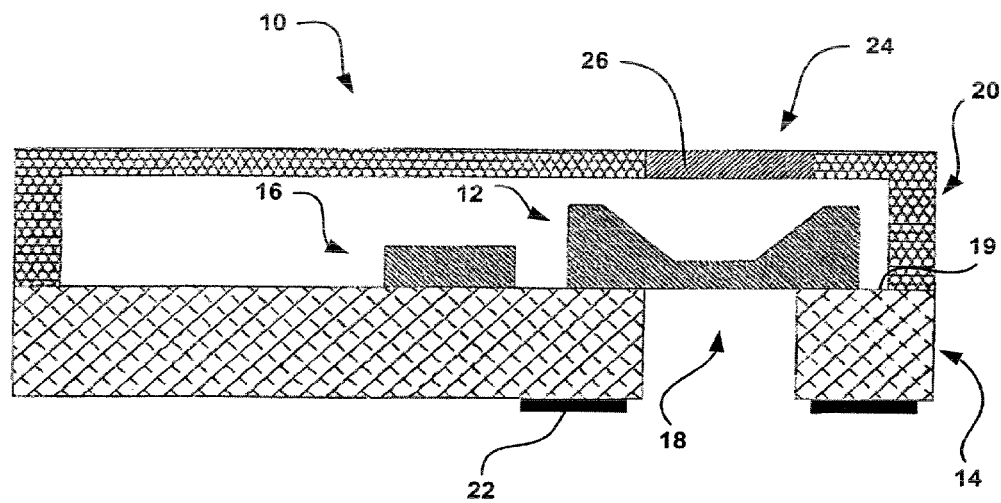
FIG. 3 is a cross-sectional view of a third embodiment of a silicon condenser microphone of the present invention.
Figure 6:
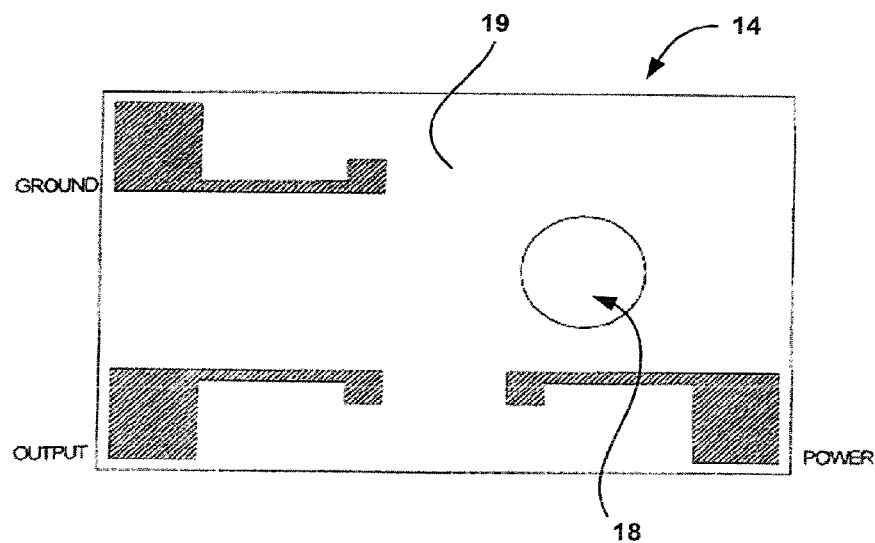
FIG. 6 is a plan view of a substrate to which a silicon condenser microphone is fixed.
Figure 7:
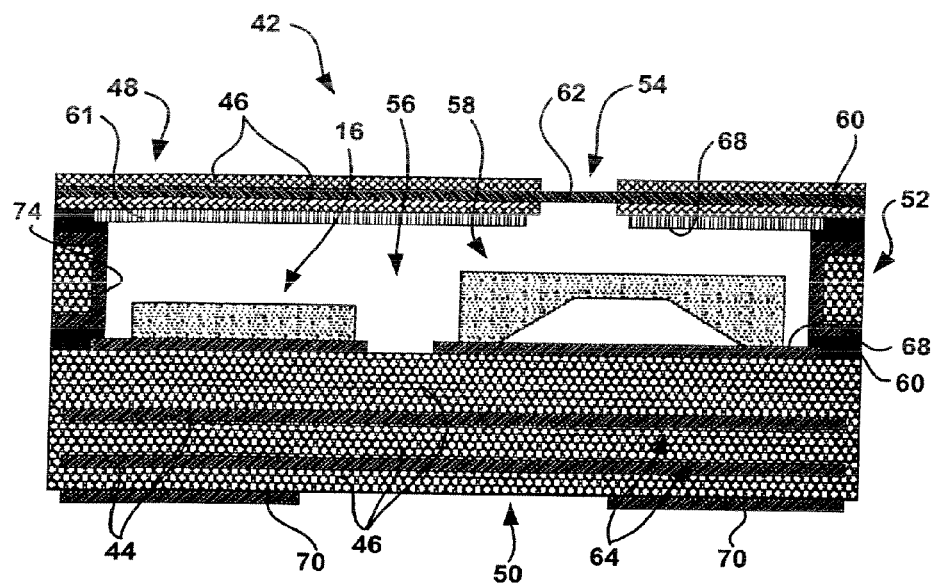
FIG. 7 is a longitudinal cross-sectional view of a microphone package of the present invention.
Figure 8:
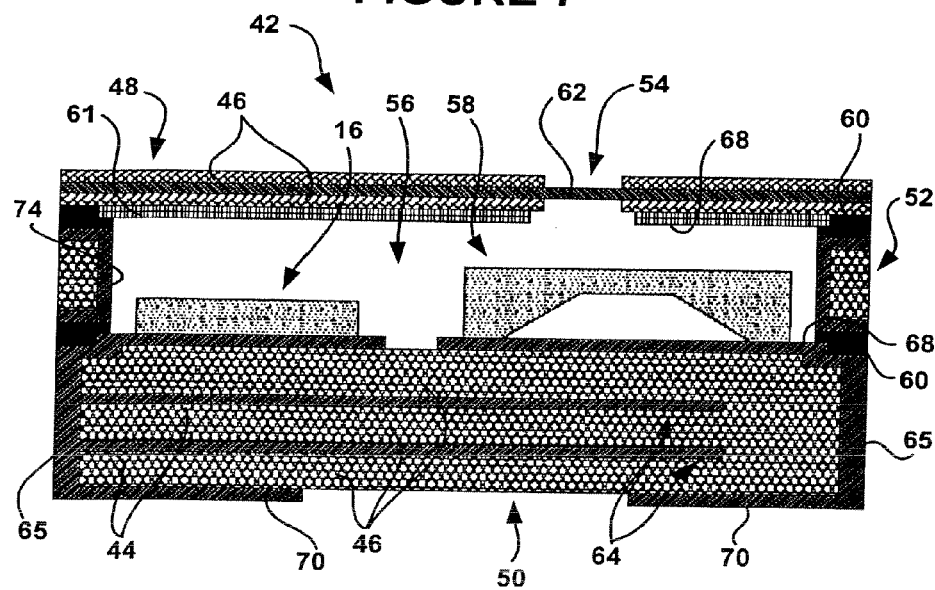
FIG. 8 is a lateral cross-sectional view of a microphone package of the present invention.
Figure 9:
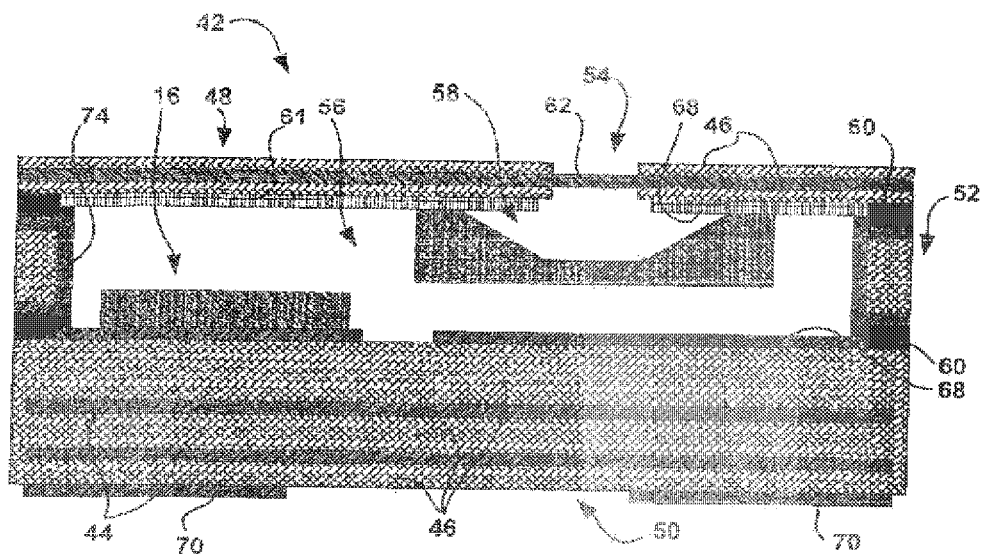
FIG. 9 is a longitudinal cross-sectional view of a microphone package of the present invention.
Figure 10:
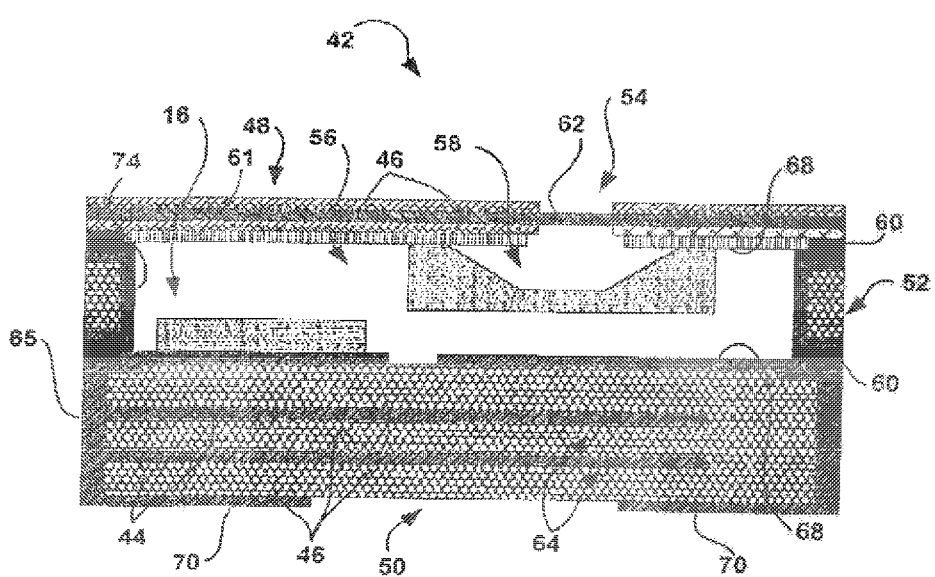
FIG. 10 is a lateral cross-sectional view of a microphone package of the present invention.

Now, referring to FIGS. 1-3, three embodiments of a silicon condenser microphone package 10 of the present invention are illustrated. Included within silicon microphone package 10 is a transducer 12, e.g. a silicon condenser microphone as disclosed in U.S. Pat. No. 5,870,482 which is hereby incorporated by reference and an amplifier 16. The package itself includes a substrate 14, a back volume or air cavity 18, which provides a pressure reference for the transducer 12, and a cover 20. The substrate 14 may be formed of FR-4 material allowing processing in circuit board panel form, thus taking advantage of economies of scale in manufacturing. FIG. 6 is a plan view of the substrate 14 showing the back volume 18 surrounded a plurality of terminal pads.

Figure 4:
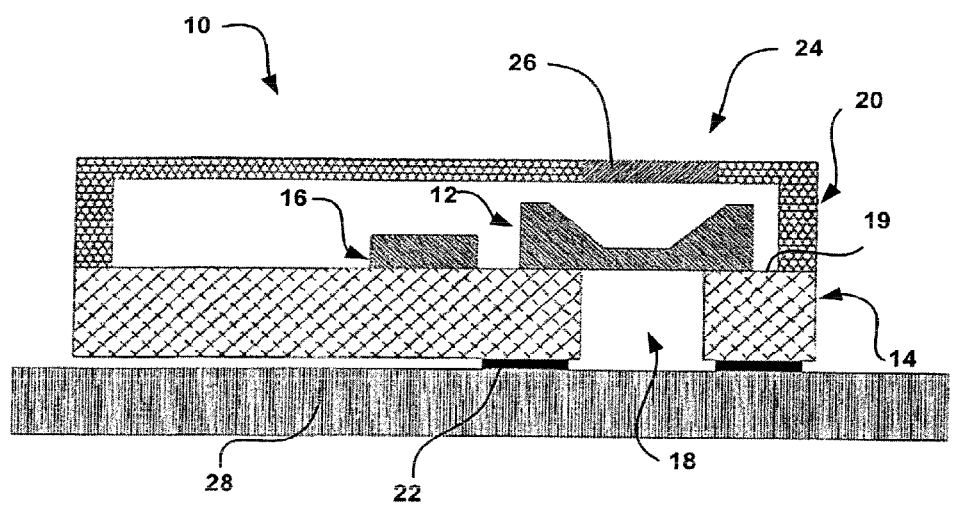
FIG. 4 is a cross-sectional view of the third embodiment of the present invention affixed to an end user circuit board.
Figure 5:
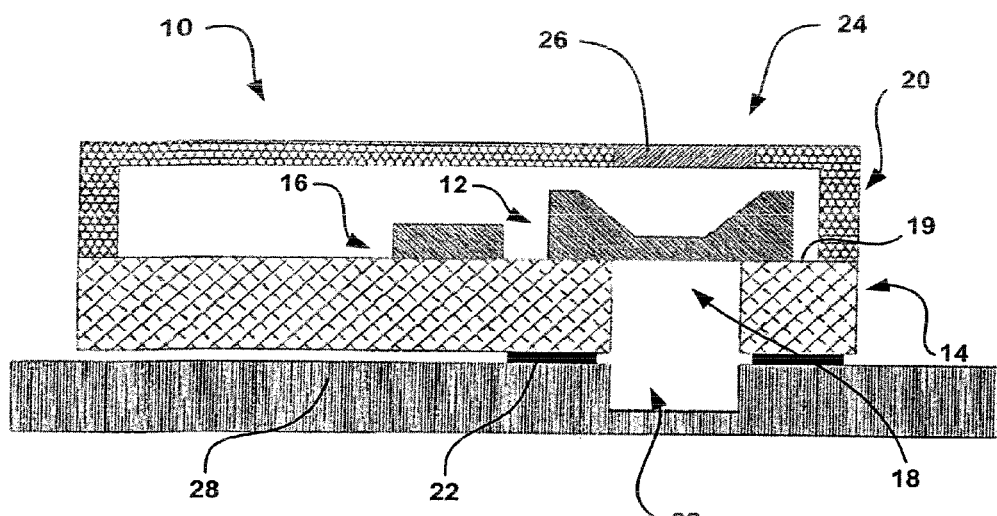
FIG. 5 is a cross-sectional view of the third embodiment of the present invention affixed to an end user circuit board in an alternate fashion.

The back volume 18 may be formed by a number of methods, including controlled depth drilling of an upper surface 19 of the substrate 14 to form a recess over which the transducer 12 is mounted (FIG. 1); drilling and routing of several individual sheets of FR-4 and laminating the individual sheets to form the back volume 18, which may or may not have internal support posts (FIG. 2); or drilling completely through the substrate 14 and providing a sealing ring 22 on the bottom of the device that will seal the back volume 18 during surface mounting to a user's "board" 28 (FIGS. 3-5). In this example, the combination of the substrate and the user's board 28 creates the back volume 18. The back volume 18 is covered by the transducer 12 (e.g., a MEMS device) which may be "bumpbonded" and mounted face down. The boundary is sealed such that the back volume 18 is operably "air-tight."

The cover 20 is attached for protection and processability. The cover 20 contains an aperture 24 which may contain a sintered metal insert 26 to prevent water, particles and/or light from entering the package and damaging the internal components inside; i.e. semiconductor chips. The aperture 24 is adapted for allowing sound waves to reach the transducer 12. The sintered metal insert 26 will also have certain acoustic properties, e.g. acoustic damping or resistance. The sintered metal insert 26 may therefore be selected such that its acoustic properties enhance the functional capability of the transducer 12 and/or the overall performance of the silicon microphone 10.

Referring to FIGS. 4 and 5 the final form of the product is a silicon condenser microphone package 10 which would most likely be attached to an end user's PCB 28 via a solder reflow process. FIG. 5 illustrates a method of enlarging the back volume 18 by including a chamber 32 within the end user's circuit board 28.

Another embodiment of a silicon condenser microphone package 40 of the present invention is illustrated in FIGS. 7-10. In this embodiment, a housing 42 is formed from layers of materials, such as those used in providing circuit boards. Accordingly, the housing 42 generally comprises alternating layers of conductive and non-conductive materials 44, 46. The non-conductive layers 46 are typically FR-4 board. The conductive layers 44 are typically copper. This multi-layer housing construction advantageously permits the inclusion of circuitry, power and ground planes, solder pads, ground pads, capacitance layers and plated through holes pads within the structure of the housing itself. The conductive layers provide EMI shielding while also allowing configuration as capacitors and/or inductors to filter input/output signals and/or the input power supply.

In the embodiment illustrated, the housing 42 includes a top portion 48 and a bottom portion 50 spaced by a side portion 52. The housing 42 further includes an aperture or acoustic port 54 for receiving an acoustic signal and an inner chamber 56 which is adapted for housing a transducer unit 58, typically a silicon die microphone or a ball grid array package (BGA). The top, bottom, and side portions 48, 50, 52 are electrically connected, for example with a conductive adhesive 60. The conductive adhesive may be provided conveniently in the form of suitably configured sheets of dry adhesive disposed between the top, bottom and side portions 48, 50 and 52. The sheet of dry adhesive may be activated by pressure, heat or other suitable means after the portions are brought together during assembly. Each portion may comprise alternating conductive and non-conductive layers of 44, 46.

The chamber 56 may include an inner lining 61. The inner lining 61 is primarily formed by conductive material. It should be understood that the inner lining may include portions of non-conductive material, as the conductive material may not fully cover the non-conductive material. The inner lining 61 protects the transducer 58 against electromagnetic interference and the like, much like a faraday cage. The inner lining 61 may also be provided by suitable electrically coupling together of the various conductive layers within the top, bottom and side portions 48, 50 and 52 of the housing.

In the various embodiments illustrated in FIGS. 7-10 and 23-26, the portions of the housing 42 that include the aperture or acoustic port 54 further include a layer of material that forms an environmental barrier 62 over or within the aperture 54. This environmental barrier 62 is typically a polymeric material formed to a film, such as a polytetrafluoroethylene (PTFE) or a sintered metal. The environmental barrier 62 is supplied for protecting the chamber 56 of the housing 42, and, consequently, the transducer unit 58 within the housing 42, from environmental elements such as sunlight, moisture, oil, dirt, and/or dust. The environmental barrier 62 will also have inherent acoustic properties, e.g. acoustic damping/resistance. Therefore the environmental barrier 62 is chosen such that its acoustic properties cooperate with the transducer unit 58 to enhance the performance of the microphone. This is particularly true in connection with the embodiments illustrated in FIGS. 24 and 25, which may be configured to operate as directional microphones.

The environmental barrier layer 62 is generally sealed between layers of the portion, top 48 or bottom 50 in which the acoustic port 54 is formed. For example, the environmental barrier may be secured between layers of conductive material 44 thereby permitting the layers of conductive material 44 to act as a capacitor (with electrodes defined by the metal) that can be used to filter input and output signals or the input power. The environmental barrier layer 62 may further serve as a dielectric protective layer when in contact with the conductive layers 44 in the event that the conductive layers also contain thin film passive devices such as resistors and capacitors.

In addition to protecting the chamber 56 from environmental elements, the barrier layer 62 allows subsequent wet processing, board washing of the external portions of the housing 42, and electrical connection to ground from the walls via thru hole plating. The environmental barrier layer 62 also allows the order of manufacturing steps in the fabrication of the printed circuit board-based package to be modified. This advantage can be used to accommodate different termination styles. For example, a double sided package can be fabricated having a pair of apertures 54 (see FIG. 25), both including an environmental barrier layer 62. The package would look and act the same whether it is mounted face up or face down, or the package could be mounted to provide directional microphone characteristics. Moreover, the environmental barrier layer 62 may also be selected so that its acoustic properties enhance the directional performance of the microphone.

Referring to FIGS. 7, 8, and 11-13 the transducer unit 58 is generally not mounted to the top portion 48 of the housing. This definition is independent of the final mounting orientation to an end user's circuit board. It is possible for the top portion 48 to be mounted face down depending on the orientation of the transducer 58 as well as the choice for the bottom portion 50. The conductive layers 44 of the top portion 48 may be patterned to form circuitry, ground planes, solder pads, ground pads, capacitors and plated through hole pads. Referring to FIGS. 1-13 there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

Figure 11:
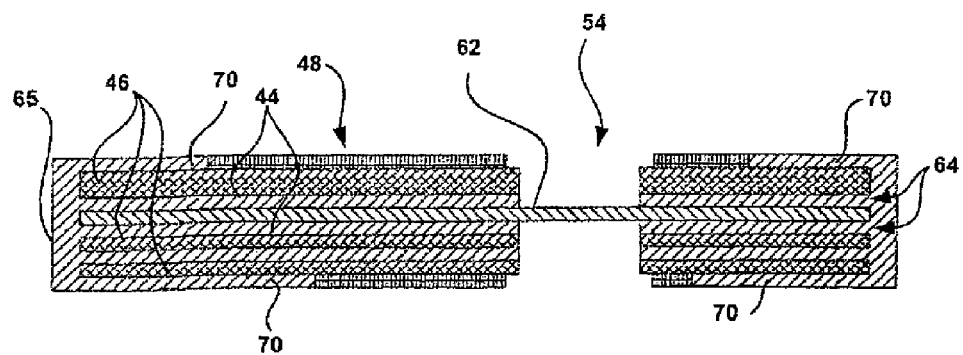
FIG. 11 is a cross-sectional view of a top portion for a microphone package of the present invention.

FIG. 11 illustrates an alternative top portion 48 for a microphone package. In this embodiment, a connection between the layers can be formed to provide a conduit to ground. The top portion of FIG. 11 includes ground planes and/or pattern circuitry 64 and the environmental barrier 62. The ground planes and or pattern circuitry 64 are connected by pins 65.

Figure 12:
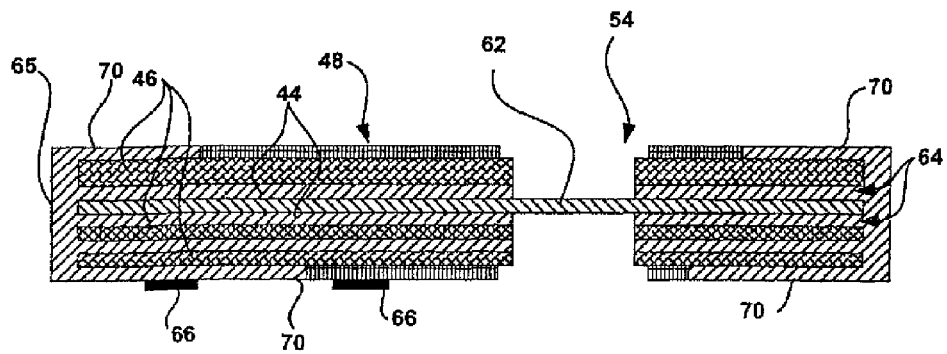
FIG. 12 is a cross-sectional view of a top portion for a microphone package of the present invention.

FIG. 12 illustrates another embodiment of a top portion 48. In addition to the connection between layers, ground planes/pattern circuitry 64, and the environmental barrier 62, this embodiment includes conductive bumps 66 (e.g. Pb/Sn or Ni/Au) patterned on the bottom side to allow secondary electrical contact to the transducer 58. Here, conductive circuitry would be patterned such that electrical connection between the bumps 66 and a plated through hole termination is made.

Figure 13:
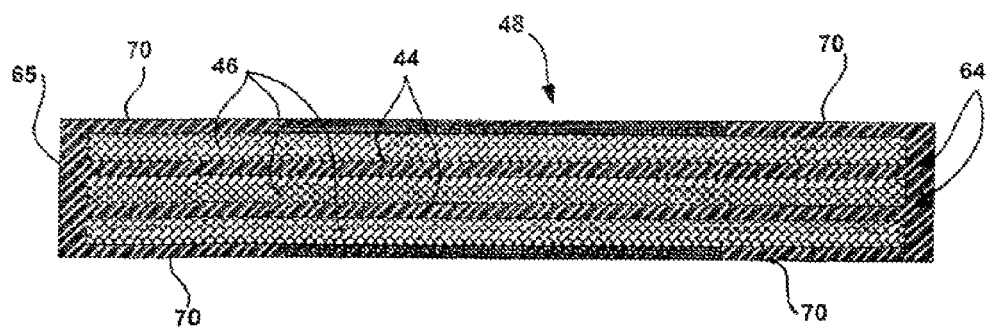
FIG. 13 is a cross-sectional view of a top portion for a microphone package of the present invention.

FIG. 13 illustrates yet another embodiment of the top portion 48. In this embodiment, the top portion 48 does not include an aperture or acoustic port 54.

Referring to FIGS. 7, 8 and 14-18, the bottom portion 50 is the component of the package to which the transducer 58 is primarily mounted. This definition is independent of the final mounting orientation to the end user's circuit board. It is possible for the bottom portion 50 to be mounted facing upwardly depending on the mounting orientation of the transducer 58 as well as the choice for the top portion 48 construction. Like the top portion 48, the conductive layers 44 of the bottom portion 50 may be patterned to form circuitry, ground planes, solder pads, ground pads, capacitors and plated through hole pads. As shown in FIGS. 14-18, there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

Figure 14A:
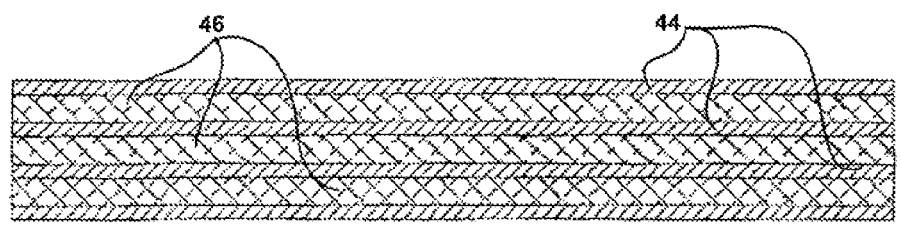
FIG. 14a is a cross-sectional view of a laminated bottom portion of a housing for a microphone package of the present invention.
Figure 14B:
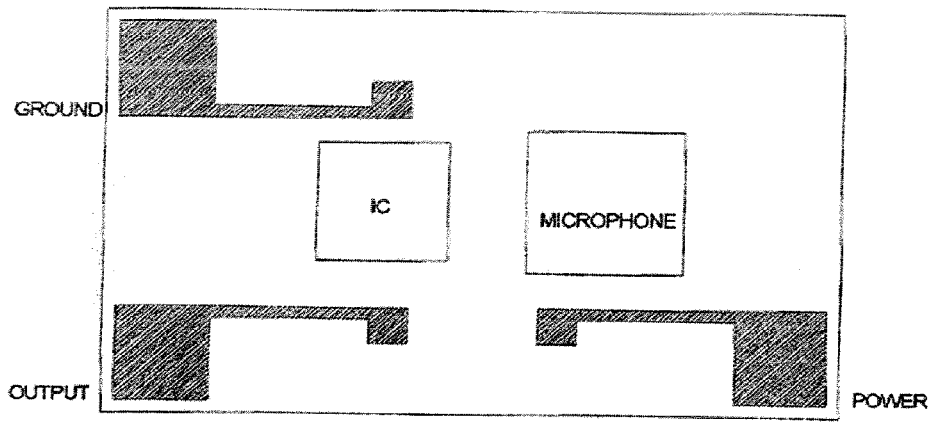

Referring to FIGS. 14a through 14d, the bottom portion 50 comprises a laminated, multi-layered board including layers of conductive material 44 deposited on layers of non-conductive material 46. Referring to FIG. 14b, the first layer of conductive material is used to attach wire bonds or flip chip bonds. This layer includes etched portions to define lead pads, bond pads, and ground pads. The pads would have holes drilled through them to allow the formation of plated through-holes.

Figure 14C:
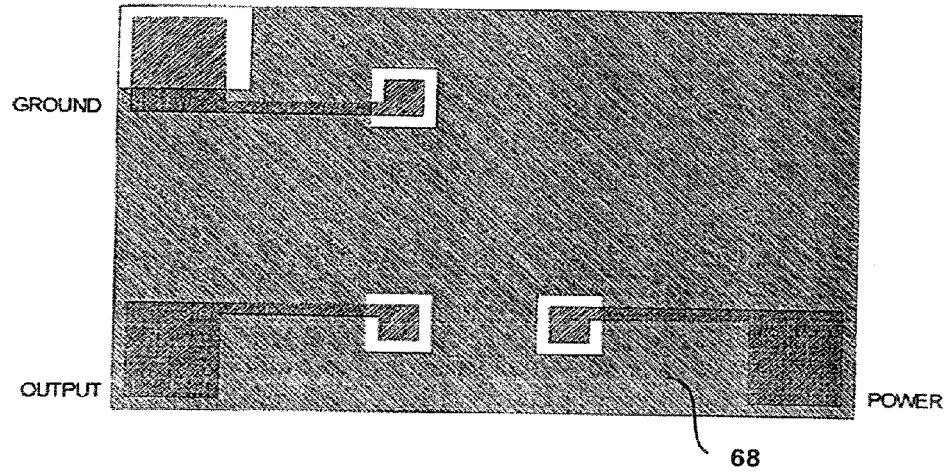

As shown in FIG. 14c, a dry film 68 of non-conductive material covers the conductive material. This illustration shows the exposed bonding pads as well as an exposed ground pad. The exposed ground pad would come in electrical contact with the conductive epoxy and form the connection to ground of the side portion 52 and the base portion 50.

Figure 14D:
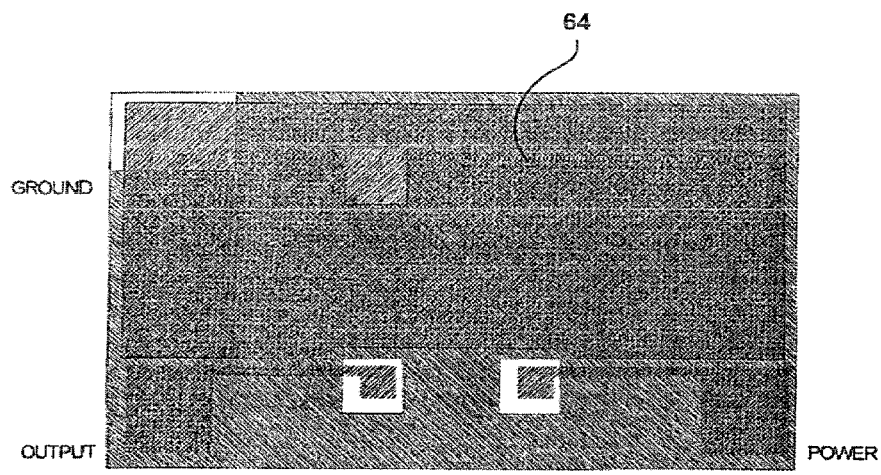

Referring to FIG. 14d, ground layers can be embedded within the base portion 50. The hatched area represents a typical ground plane 64. The ground planes do not overlap the power or output pads, but will overlap the transducer 58.

Figure 15:
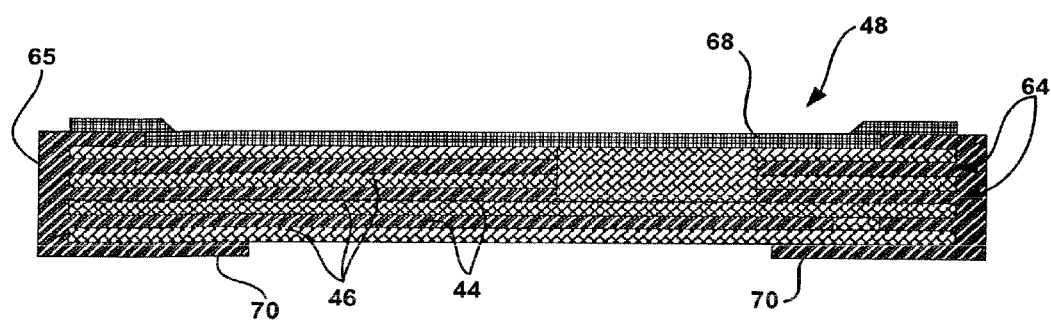
FIG. 15 is a cross-sectional view of a bottom portion for a microphone package of the present invention.

Referring to FIG. 15, an embodiment of the bottom portion 50 is illustrated. The bottom portion 50 of this embodiment includes a solder mask layer 68 and alternating layers of conductive and non-conductive material 44, 46. The bottom portion further comprises solder pads 70 for electrical connection to an end user's board.

Figure 16:
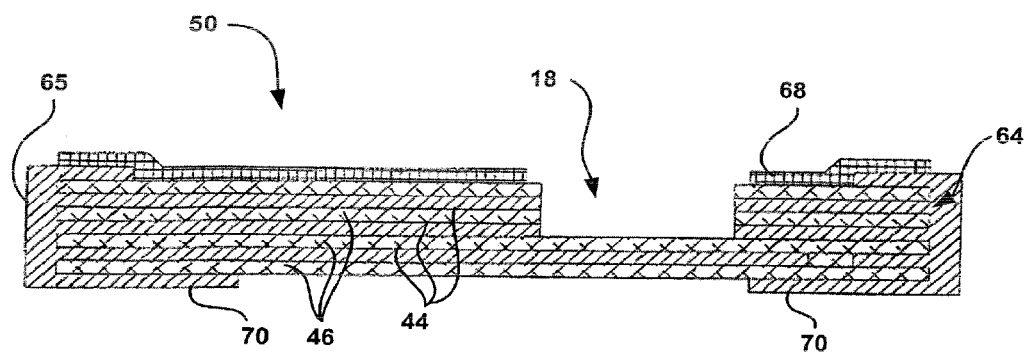
FIG. 16 is a cross-sectional view of a bottom portion for a microphone package of the present invention.
Figure 17:
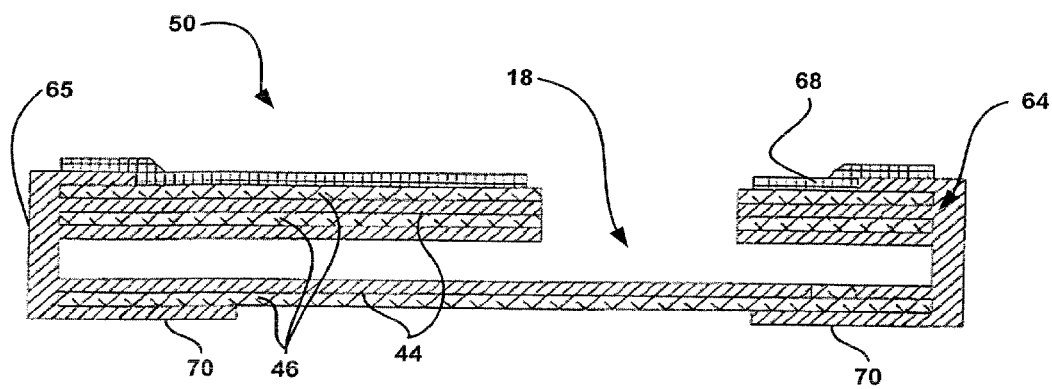
FIG. 17 is a cross-sectional view of a bottom portion for a microphone package of the present invention.

FIGS. 16 and 17 illustrate embodiments of the bottom portion 50 with enlarged back volumes 18. These embodiments illustrate formation of the back volume 18 using the conductive/non-conductive layering.

Figure 18:
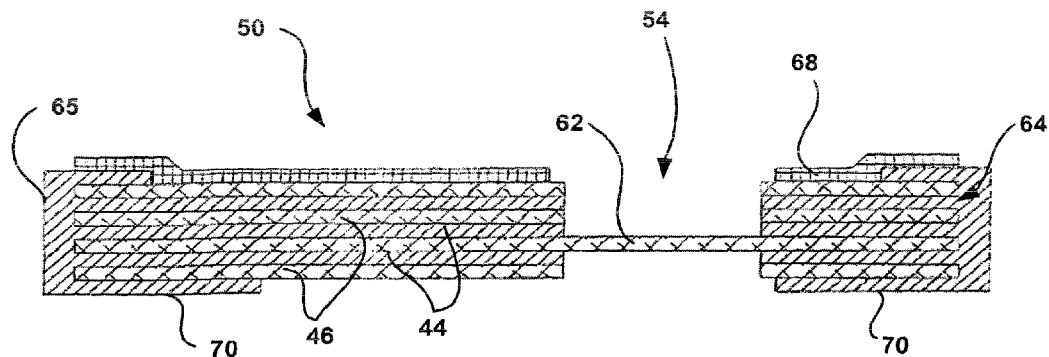
FIG. 18 is a cross-sectional view of a bottom portion for a microphone package of the present invention.

FIG. 18 shows yet another embodiment of the bottom portion 50. In this embodiment, the back portion 50 includes the acoustic port 54 and the environmental barrier 62.

Referring to FIGS. 7-10 and 19-22, the side portion 52 is the component of the package that joins the bottom portion 50 and the top portion 48. The side portion 52 may include a single layer of a non-conductive material 46 sandwiched between two layers of conductive material 44. The side portion 52 forms the internal height of the chamber 56 that houses the transducer 58. The side portion 52 is generally formed by one or more layers of circuit board material, each having a routed window 72 (see FIG. 19).

Figure 19:
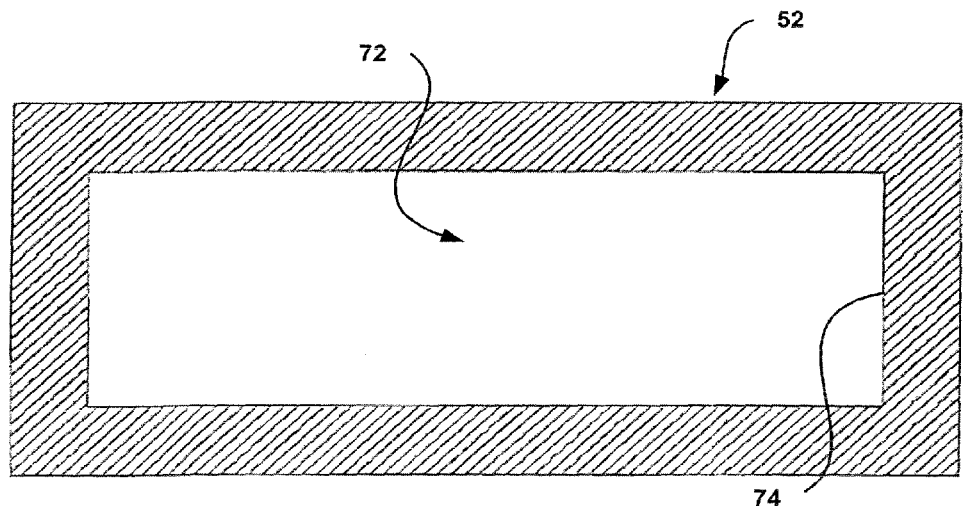
FIG. 19 is a plan view of a side portion for a microphone package of the present invention.
Figure 20:
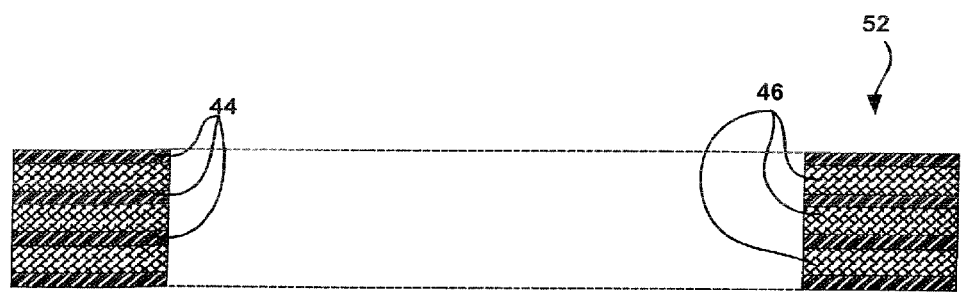
FIG. 20 is a cross-sectional view of a side portion for a microphone package of the present invention.
Figure 21:
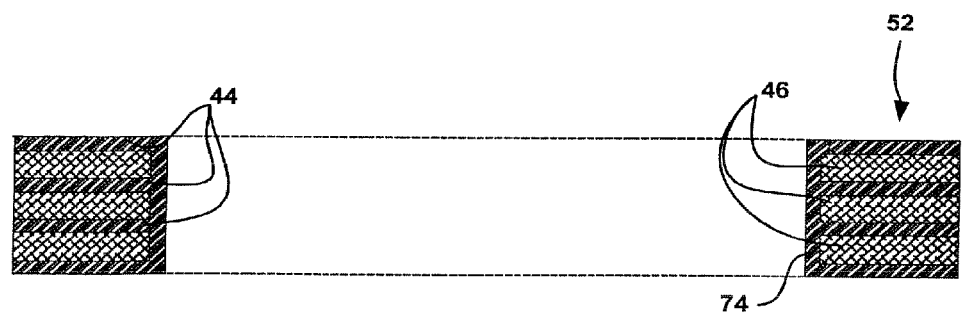
FIG. 21 is a cross-sectional view of a side portion for a microphone package of the present invention.
Figure 22:
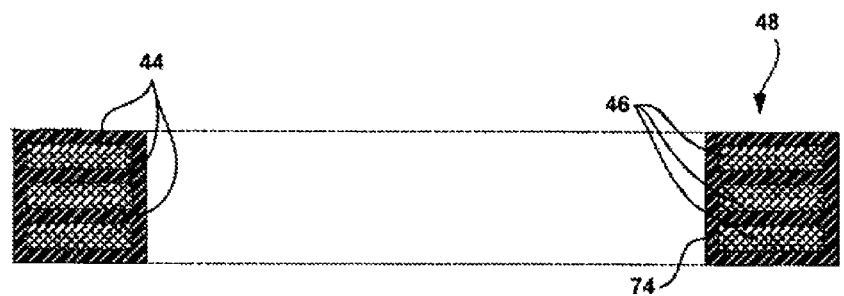
FIG. 22 is a cross-sectional view of a side portion for a microphone package of the present invention.

Referring to FIGS. 19-22, the side portion 52 includes inner sidewalls 74. The inner sidewalls 74 are generally plated with a conductive material, typically copper, as shown in FIGS. 20 and 21. The sidewalls 74 are formed by the outer perimeter of the routed window 72 and coated/metallized with a conductive material.

Alternatively, the sidewalls 74 may be formed by may alternating layers of non-conductive material 46 and conductive material 44, each having a routed window 72 (see FIG. 19). In this case, the outer perimeter of the window 72 may not require coverage with a conductive material because the layers of conductive material 44 would provide effective shielding.

FIGS. 23-26 illustrate various embodiments of the microphone package 40. These embodiments utilize top, bottom, and side portions 48, 50, and 52 which are described above. It is contemplated that each of the top, bottom, and side portion 48, 50, 52 embodiments described above can be utilized in any combination without departing from the invention disclosed and described herein.

Figure 23:
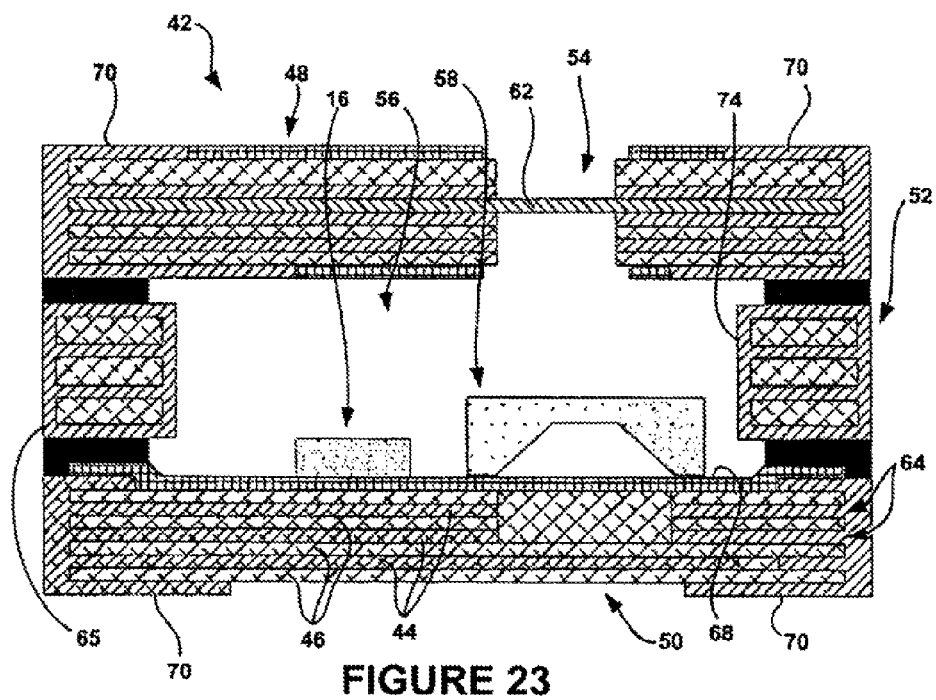
FIG. 23 is a cross-sectional view of a microphone package of the present invention.

In FIG. 23, connection to an end user's board is made through the bottom portion 50. The package mounting orientation is bottom portion 50 down. Connection from the transducer 58 to the plated through holes is be made by wire bonding. The transducer back volume 18 is formed by the back hole (mounted down) of the silicon microphone only. Bond pads, wire bonds and traces to the terminals are not shown. A person of ordinary skilled in the art of PCB design will understand that the traces reside on the first conductor layer 44. The wire bonds from the transducer 58 are be connected to exposed pads. The pads are connected to the solder pads via plated through holes and traces on the surface.

Figure 24:
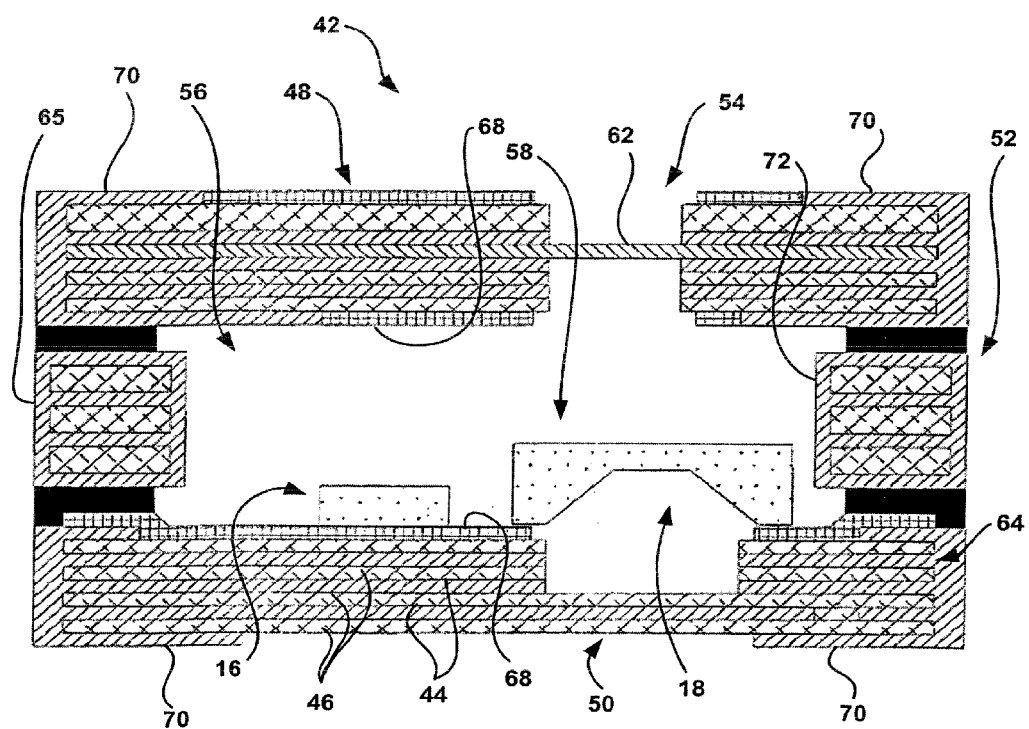
FIG. 24 is a cross-sectional view of a microphone package of the present invention.

In FIG. 24, connection to the end user's board is also made through the bottom portion 50. Again, the package mounting orientation is bottom portion 50. Connection from the transducer 58 to the plated through holes are made by wire bonding. The back volume is formed by a combination of the back hole of the transducer 58 (mounted down) and the bottom portion 50.

Figure 25:
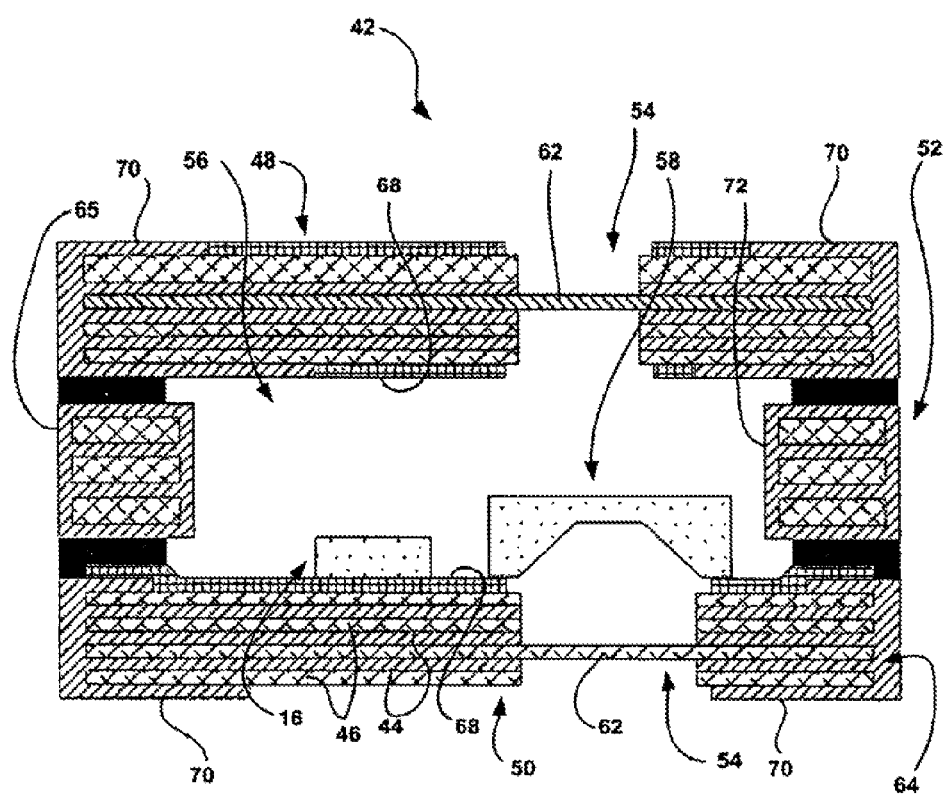
FIG. 25 is a cross-sectional view of a microphone package of the present invention.

In FIG. 25, connection to the end user's board is also made through the bottom portion 50. Again, the package mounting orientation is bottom portion 50. Connection from the transducer 58 to the plated through holes are made by wire bonding. With acoustic ports 54 on both sides of the package, there is no back volume. This method is suitable to a directional microphone.

Figure 26:
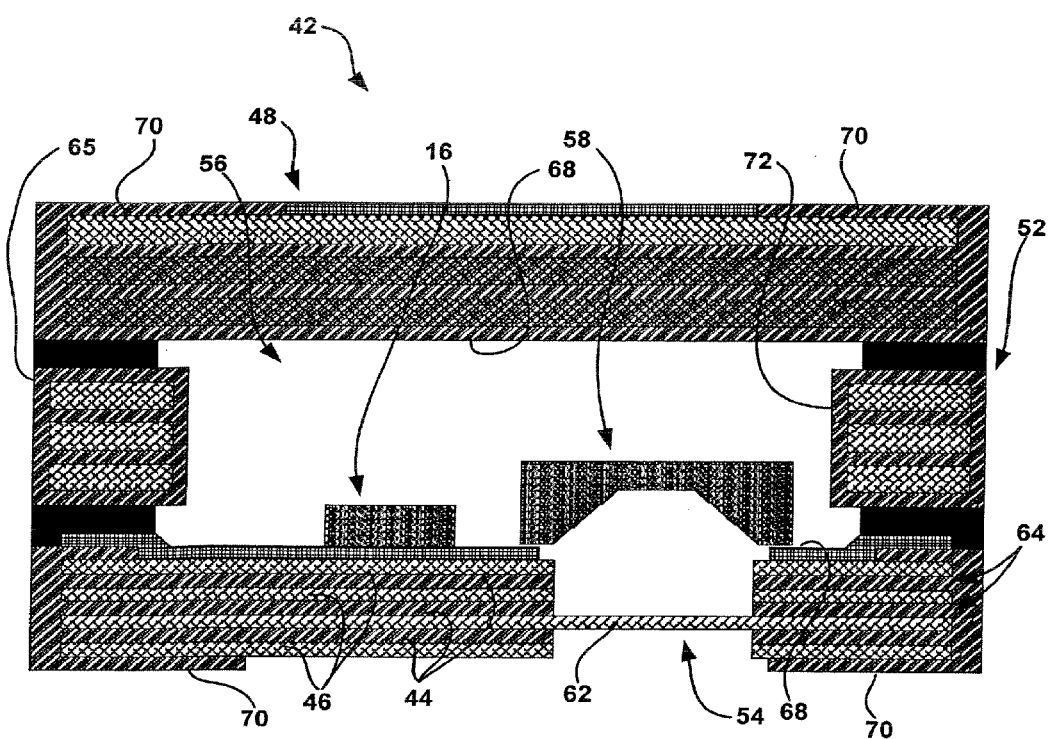
FIG. 26 is a cross-sectional view of a microphone package of the present invention.

In FIG. 26, connection to the end user's board is made through the top portion 48 or the bottom portion 53. The package mounting orientation is either top portion 48 down or bottom portion 50 down. Connection from the transducer 58 to the plated through holes is made by flip chipping or wire bonding and trace routing. The back volume 18 is formed by using the air cavity created by laminating the bottom portion 50 and the top portion 48 together. Some portion of the package fabrication is performed after the transducer 58 has been attached. In particular, the through hole formation, plating, and solder pad definition would be done after the transducer 58 is attached. The protective membrane 62 is hydrophobic and prevents corrosive plating chemistry from entering the chamber 56.

Figure 27:
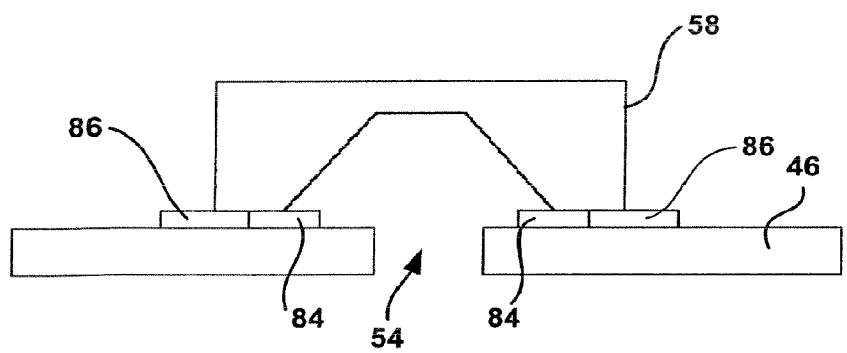
FIG. 27 is a cross-sectional view of a microphone package of the present invention with a retaining ring.
Figure 28:
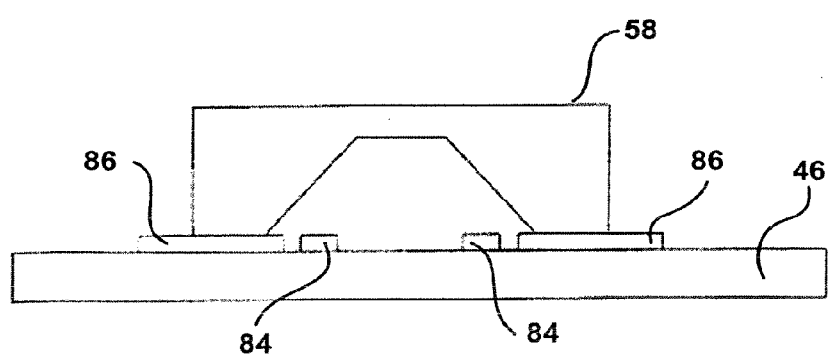
FIG. 28 is a cross-sectional view of a microphone package of the present invention with a retaining wing.
Figure 29:
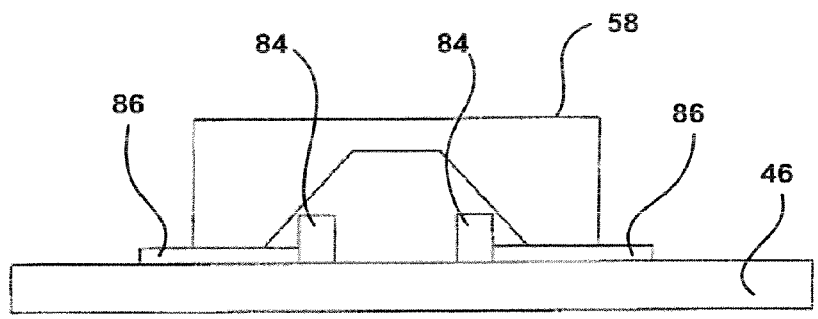
FIG. 29 is a cross-sectional view of a microphone package of the present invention with a retaining ring.

Referring to FIGS. 27-29, the portion to which the transducer unit 58 is mounted may include a retaining ring 84. The retaining ring 84 prevents wicking of an epoxy 86 into the transducer 58 and from flowing into the acoustic port or aperture 54. Accordingly, the shape of the retaining ring 84 will typically match the shape of the transducer 58 foot print. The retaining ring 84 comprises a conductive material (e.g., 3 mil. thick copper) imaged on a non-conductive layer material.

Referring to FIG. 27, the retaining ring 84 is imaged onto a nonconductive layer. An epoxy is applied outside the perimeter of the retaining ring 84, and the transducer 58 is added so that it overlaps the epoxy 86 and the retaining ring 84. This reduces epoxy 86 wicking up the sides of the transducer's 58 etched port (in the case of a silicon die microphone).

Alternatively, referring to FIG. 28, the retaining ring 84 can be located so that the transducer 58 does not contact the retaining ring 84. In this embodiment, the retaining ring 84 is slightly smaller than the foot print of the transducer 58 so that the epoxy 86 has a restricted path and is, thus, less likely to wick. In FIG. 29, the retaining ring 84 is fabricated so that it contacts the etched port of the transducer 58. The following tables provide an illustrative example of a typical circuit board processing technique for fabrication of the housing of this embodiment.

TABLE 1

Materials

| Material | Type | Component | Note |
| --- | --- | --- | --- |
| 1 | 0.5/0.5 oz. DST Cu 5 core FR-4 | Bottom Portion (Conductive Layers Non-Conductive Layer 1) | |
| 2 | 0.5/0.5 oz. DST Cu 5 core FR-4 | Bottom Portion (Conductive Layers 3 and 4; Non-Conductive Layer 2) | |
| 3 | 106 pre-preg | | For Laminating Material 1 and Material 2 |
| 4 | 0.5/0.5 oz. DST Cu 40 Core FR-4 | Side Portion | Metallized Afterward |
| 5 | Bare/0.5 oz. Cu 2 core FR-4 (2 pieces) | Top Portion (Each Piece Includes 1 Conductive and 1 Non-Conductive Layer) | |
| 6 | Expanded PTFE | Environmental Barrier | |

TABLE 2

Processing of Materials (Base Portion Material 1)

| Step | Type | Description | Note |
| --- | --- | --- | --- |
| 1 | Dry Film Conductive Layers | | |
| 2 | Expose | Mask Material 1 (Upper Conductive Layer) | Forms Ground Plane on Lower Conductive Layer |
| 3 | Develop | | |
| 4 | Etch Cu | | No Etching on Upper Conductive Layer |
| 5 | Strip Dry Film | | |

TABLE 3

Processing of Materials (Bottom Portion Material 2)

| Step | Type | Description | Note |
|---|---|---|---|
| 1 | Dry Film Conductive Layers | | |
| 2 | Expose | Mask Material 2 (Upper Conductive Layer) | Forms Ground Plane on Upper Conductive Layer |
| 3 | Develop | | |
| 4 | Etch Cu | | No Etching on Upper Conductive Layer |
| 5 | Strip Dry Film | | |

TABLE 4

Processing of Materials 1, 2, and 3 (Form Bottom Portion)

| Step | Type | Description | Note |
|---|---|---|---|
| 1 | Laminate | Materials 1 and 2 Laminated Using Material 3 | |
| 2 | Drill Thru Holes | Drill Bit = 0.025 in. | |
| 3 | Direct Metallization/Flash Copper | Plates Thru Holes | |
| 4 | Dry Film (L1 and L4) | | |
| 5 | Expose | Mask Laminated Materials 1 and 2 (Upper and Lower Conductive Layers) | Forms Traces and Solder Pads |
| 6 | Develop | | |
| 7 | Electrolytic Cu | 1.0 mil | |
| 8 | Electrolytic Sn | As Required | |
| 9 | Strip Dry Film | | |
| 10 | Etch Cu | | |
| 11 | Etch Cu | | |
| 12 | Insert Finishing Option Here | NG Option (See Table Below) | NG Option for Proof of Principle |
| 13 | Dry Film (cover lay) on Upper Conductive Layer Only | 2.5 mil | Minimum Thickness on Upper Conductive Layer |
| 14 | Expose | Mask Laminated Materials 1 and 2 (upper and lower) | This mask defines an area on the upper conductive layer that will receive a dry film solder mask (cover lay). The bottom layer will not have dry film applied to it. The plated through holes will be bridged over by the coating on the top. |
| 15 | Develop | | |
| 16 | Cure | | Full Cure |
| 17 | Route Panels | Route Bit = As Required | Forms 4" × 4" pieces. Conforms to finished dims |

Table 5 describes the formation of the side portion 52. This process involves routing a matrix of openings in FR-4 board. However, punching is thought to be the cost effective method for manufacturing. The punching may done by punching through the entire core, or, alternatively, punching several layers of no-flow pre-preg and thin core c-stage which are then laminated to form the wall of proper thickness.

After routing the matrix, the board will have to be electroless or DM plated. Finally, the boards will have to be routed to match the bottom portion. This step can be done first or last. It may make the piece more workable to perform the final routing as a first step.

TABLE 5

Processing of Material 4 (Side Portion)

| Step | Type | Description | Note |
|---|---|---|---|
| 1 | Route/Punch Matrix of Openings | Route Bit = 0.031 in. | Forms Side Portion |
| 2 | Direct Metallization/Flash Cu | 0.25 mil minimum | Forms Sidewalls on Side Portion |
| 3 | Route Panels | | |

Table 6 describes the processing of the top portion. The formation of the top portion 48 involves imaging a dry film cover lay or liquid solder mask on the bottom (i.e. conductive layer forming the inner layer. The exposed layer of the top portion 48 will not have a copper coating. It can be processed this way through etching or purchased this way as a one sided laminate.

A matrix of holes is drilled into the lid board. Drilling may occur after the imaging step. If so, then a suitable solder mask must be chosen that can survive the drilling process.

TABLE 6

Processing of Top Portion

| Step | Type | Description | Note |
|---|---|---|---|
| 1 | Dry Film | Conductive Layer | |
| 2 | Expose | Mask Bare Layer | Form Conduction Ring |
| 3 | Develop | | |
| 4 | Cure | | |
| 5 | Drill Matrix of Holes | Drill Bit 0.025 in. | Acoustic Ports |
| 6 | Laminate | PTFE (Environmental Barrier) Between 2 Pieces of Material 5 | Forms Top Portion |

TABLE 7

Processing of Laminated Materials 1 and 2 with Material 4

| Step | Type | Description | Note |
|---|---|---|---|
| 1 | Screen Conductive Adhesive on Material 4 | | |
| 2 | Laminate | Bottom Portion with Side Portion | Forms Bottom Portion with Side Portion (spacer) |
| 3 | Add Transducer Assembly | Silicon Die Microphone and Integrated Circuit | |

TABLE 8

Processing of Laminated Materials 1, 2, and 4 with Material 5

| Step | Type | Description | Note |
|---|---|---|---|
| 1 | Screen Conductive Adhesive on Top Portion | | |
| 2 | Laminate | Bottom Portion and Side Portion with Top Portion | Forms Housing |
| 3 | Dice | | |

TABLE 9

Finishing Option NG (Nickel/Gold)

| Step | Type | Description | Note |
|------|------|-------------|------|
| 1 | Immersion Ni (40-50 μ-in) | | |
| 2 | Immersion Au (25-30 μ-in) | | |

TABLE 10

Finishing Option NGT (Nickel/Gold/Tin)

| Step | Type |
|------|------|
| 1 | Mask L2 (using thick dry film or high tack dicing tape) |
| 2 | Immersion Ni (40-50 μ-in) |
| 3 | Immersion Au (25-30 μ-in) |
| 4 | Remove Mask on L2 |
| 5 | Mask L1 (using thick dry film or high tack dicing tape) bridge over cavity created by wall |
| 6 | Immersion Sn (100-250 μ-in) |
| 7 | Remove Mask on L1 |

TABLE 11

Finishing Option ST (Silver/Tin)

| Step | Type |
|------|------|
| 1 | Mask L2 (using thick dry film or high tack dicing tape) |
| 2 | Immersion Ag (40-50 μ-in) |
| 3 | Remove Mask on L2 |
| 4 | Mask L1 (using thick dry film or high tack dicing tape) bridge over cavity created by wall |
| 5 | Immersion Sn (100-250 μ-in) |
| 6 | Remove Mask on L1 |

Figure 30:
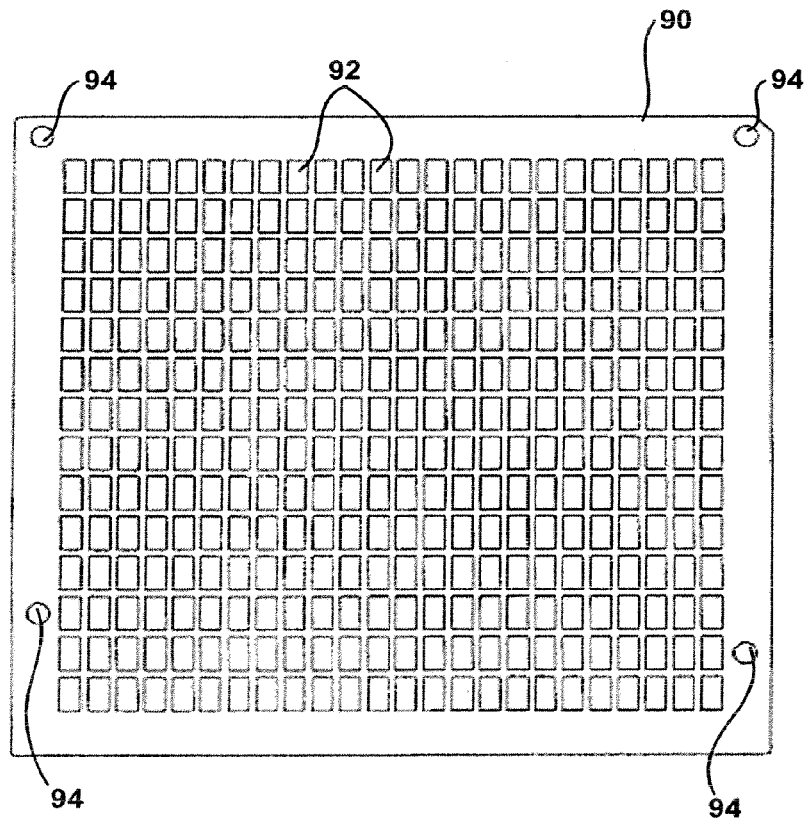
FIG. 30 is a plan view of a panel of a plurality of microphone packages.

FIG. 30 is a plan view illustrating a panel 90 for forming a plurality of microphone packages 92. The microphone packages 92 are distributed on the panel 90 in a 14×24 array, or 336 microphone packages total. Fewer or more microphone packages may be disposed on the panel 90, or on smaller or larger panels. As described herein in connection with the various embodiments of the invention, the microphone packages include a number of layers, such as top, bottom and side portions of the housing, environmental barriers, adhesive layers for joining the portions, and the like. To assure alignment of the portions as they are brought together, each portion may be formed to include a plurality of alignment apertures 94. To simultaneously manufacture several hundred or even several thousand microphones, a bottom layer, such as described herein, is provided. A transducer, amplifier and components are secured at appropriate locations on the bottom layer corresponding to each of the microphones to be manufactured. An adhesive layer, such as a sheet of dry adhesive is positioned over the bottom layer, and a sidewall portion layer is positioned over the adhesive layer. An additional dry adhesive layer is positioned, followed by an environmental barrier layer, another dry adhesive layer and the top layer. The dry adhesive layers are activated, such as by the application of heat and/or pressure. The panel is then separated into individual microphone assemblies using known panel cutting and separating techniques.

Figure 31:
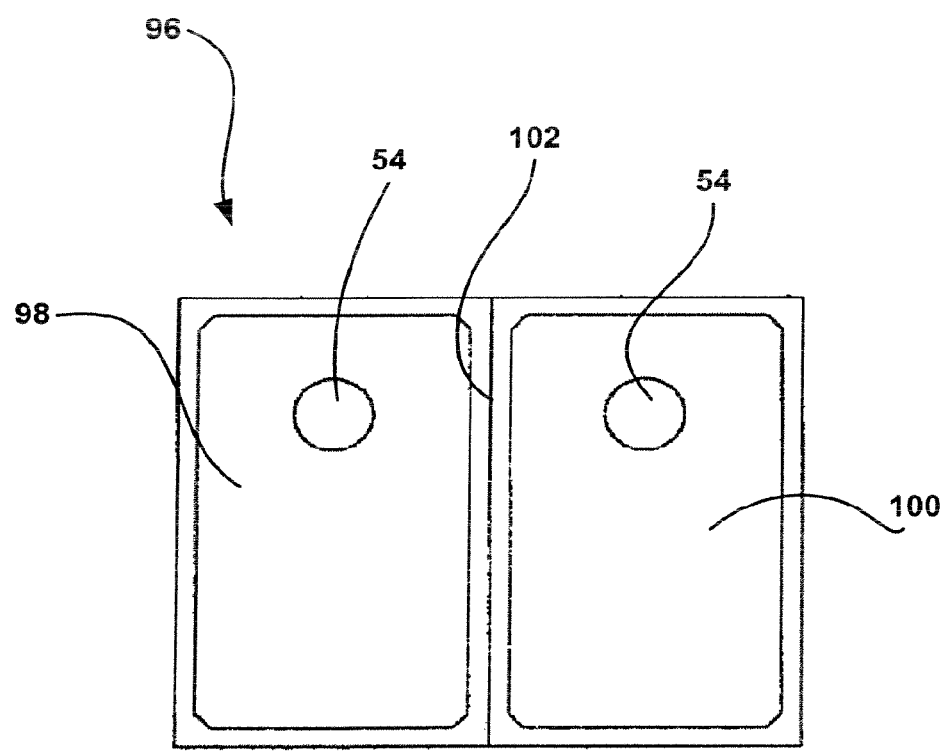
FIG. 31 is a plan view of a microphone pair.

The microphone, microphone package and method of assembly herein described further allow the manufacture of multiple microphone assembly, such as microphone pairs. In the simplest form, during separation two microphones may be left joined together, such as the microphone pair 96 shown in FIG. 31. Each microphone 98 and 100 of the microphone pair 96 is thus a separate, individually operable microphone in a single package sharing a common sidewall 102. Alternatively, as described herein, conductive traces may be formed in the various layers of either the top or bottom portion thus allowing multiple microphones to be electrically coupled.

While specific embodiments have been illustrated and described, numerous modifications come to mind without significantly departing from the spirit of the invention, and the scope of protection is only limited by the scope of the accompanying Claims.

What is claimed is:

1. A solder reflow surface mount micro-electro-mechanical system (MEMS) microphone, the microphone comprising:
   a lid having top and bottom surfaces and comprising at least one conductive layer, at least one non-conductive layer, and an acoustic port, wherein the at least one conductive layer comprises the bottom surface of the lid, wherein the bottom surface has an attachment region and an interior region, the attachment region positioned between the interior region and the edges of the lid, and completely bounding the interior region;
   a sidewall spacer having top and bottom surfaces and comprising at least two conductive layers with a center layer of non-conductive material having a predefined thickness disposed between the two conductive layers, wherein one conductive layer comprises the top surface of the sidewall spacer and the other conductive layer comprises the bottom surface of the sidewall spacer, wherein the sidewall spacer further comprises an opening having walls covered with conductive material, and the opening walls extend through the center layer to the top surface and the bottom surface;
   a substrate comprising:
      a base layer comprised of at least one layer of non-conductive material, wherein the base layer has a planar top surface and a planar bottom surface, the top surface having an interior region and an attachment region, the attachment region disposed between the interior region and the edges of the base layer, and completely bounding the interior region;
      a first plurality of metal pads disposed on the top surface of the base layer, wherein at least one pad of the first plurality of metal pads is located in the attachment region of the top surface of the base layer;
      a second plurality of metal pads disposed on the bottom surface of the base layer, the second plurality of metal pads arranged to be within the edges of the base layer; and
      one or more electrical pathways disposed completely within the base layer, wherein the pathways electrically couple one or more of the first plurality of metal pads on the top surface of the base layer to one or more of the second plurality of metal pads on the bottom surface of the base layer, and wherein the at least one metal pad located in the attachment region of the top surface of the base layer is electrically coupled to one or more of the second plurality of metal pads;
   a MEMS microphone die mounted on the bottom surface of the lid, and electrically coupled to at least one of the first plurality of metal pads on the top surface of the base layer;
   wherein the substrate, the sidewall spacer and the lid cooperate with each other to form a housing, wherein the edges of the substrate, the sidewall spacer, and the lid create side surfaces substantially perpendicular to the bottom surface of the substrate, and wherein the housing has an internal acoustic chamber for the MEMS microphone die;

wherein the bottom surface of the sidewall spacer is coupled to the attachment region of the top surface of the substrate such that the opening of the sidewall spacer and the interior region of the top surface of the substrate are aligned, and the conductive material on the opening walls of the sidewall spacer is electrically coupled to the at least one metal pad located in the attachment region of the substrate;

wherein the top surface of the sidewall spacer is coupled to the attachment region of the bottom surface of the lid such that the opening of the sidewall spacer and the interior region of the bottom surface of the lid are aligned, and the conductive layer of the lid is electrically coupled to the conductive material on the opening walls of the sidewall spacer; and wherein the interior region of the top surface of the substrate, the opening walls of the sidewall spacer, and the interior region of the bottom surface of the lid, when attached, define the acoustic chamber for the MEMS microphone die.

2. A surface mount MEMS microphone according to claim 1, further comprising at least one passive electrical element electrically coupled between one of the first plurality of metal pads and one of the second plurality of metal pads.

3. A surface mount MEMS microphone according to claim 2, wherein the at least one passive electrical element is disposed within the base layer of the substrate.

4. A surface mount MEMS microphone according to claim 2, wherein the at least one passive electrical element filters one or more of an input signal, an output signal, or input power.

5. A surface mount MEMS microphone according to claim 1, wherein the lid is attached to the sidewall spacer with a first conductive material, and the substrate is attached to the sidewall spacer with a second conductive material.

6. A surface mount MEMS microphone according to claim 1, wherein the housing protects the MEMS microphone die from at least one of light, electromagnetic interference, and physical damage.

7. A surface mount MEMS microphone according to claim 1, wherein the lid further comprises a material layer that that substantially blocks environmental contaminants from entering the acoustic chamber through the acoustic port.

8. A surface mount MEMS microphone according to claim 1, wherein the acoustic port is disposed in a position offset from the lid centerpoint.

9. A surface mount MEMS microphone according to claim 1, wherein the center layer of the sidewall spacer comprises multiple layers of non-conductive material.

10. A surface mount MEMS microphone according to claim 1, wherein the center layer of the sidewall spacer comprises multiple layers of conductive and non-conductive material, and the conductive material on the opening walls electrically couples the conductive layers to each other.

11. A surface mount MEMS microphone according to claim 1, wherein the base layer of the substrate comprises at least one additional non-conductive layer and at least one additional conductive layer.

12. A surface mount MEMS microphone according to claim 1, wherein the acoustic port in the lid is a first acoustic port, and the base layer of the substrate further comprises a second acoustic port.

13. A surface mount MEMS microphone according to claim 12, wherein the base layer of the substrate further comprises a material layer that that substantially blocks environmental contaminants from reaching the MEMS microphone die through the second acoustic port in the base layer.

14. A surface mount MEMS microphone according to claim 12, wherein the housing further comprises a material that substantially blocks environmental contaminants from entering the acoustic chamber through one or both of the first and second acoustic ports.

15. A surface mount MEMS microphone according to claim 1, wherein electrical continuity is present between the conductive layer in the lid, the conductive material on the opening walls of the sidewall spacer, and at least one of the second plurality of metal pads.

16. A surface mount MEMS microphone according to claim 1, wherein the at least one non-conductive layer of the lid, the center layer of non-conductive material of the sidewall spacer, and the at least one layer of non-conductive material of the base layer each have a substantially similar predetermined coefficient of thermal expansion.

17. A surface mount MEMS microphone according to claim 1, wherein the at least one passive electrical element is disposed within the base layer of the substrate and comprises a dielectric or resistive material that is different from the non-conductive material of the base layer.

18. A solder reflow surface mount micro-electro-mechanical system (MEMS) microphone, the microphone comprising:

a top portion having upper and lower surfaces and comprising at least one metal layer, at least one printed circuit board material layer, and an acoustic port, wherein the at least one metal layer comprises the lower surface of the top portion, wherein the lower surface has a coupling area and an inner area, the coupling area being arranged between the inner area and the edges of the top portion, and completely surrounding the inner area;

a spacer portion having upper and lower surfaces and comprising at least two metal layers with at least one printed circuit board material layer of predefined thickness disposed between the two metal layers, wherein one metal layer comprises the upper surface of the spacer portion and the other metal layer comprises the lower surface of the spacer portion, wherein the spacer portion further comprises a window having walls covered with a metal layer, and the window walls extend through the printed circuit board material layer to the upper surface and the lower surface;

a bottom portion comprising:

a base layer comprised of at least one layer of printed circuit board material, wherein the base layer has a substantially flat upper surface and a substantially flat lower surface, the upper surface having an inner area and a coupling area, the coupling area located between the inner area and the edges of the base layer, and completely surrounding the inner area;

a plurality of metal pads located on the upper surface of the base layer, wherein at least one pad of the plurality of metal pads is positioned in the coupling area of the upper surface of the base layer;

a plurality of solder pads located on the lower surface of the base layer, the plurality of solder pads arranged to be within the edges of the base layer;

one or more electrical connections passing through the base layer, wherein the connections electrically couple one or more of the plurality of metal pads on the upper surface of the base layer to one or more of the plurality of solder pads on the lower surface of the base layer, and wherein the at least one metal pad positioned in the coupling area of the upper surface of the base layer is electrically coupled to one or more of the plurality of solder pads; and at least one passive electrical element electrically coupled between one of the plurality of metal pads and one of the plurality of solder pads;

a MEMS microphone die physically coupled to the lower surface of the top portion, and electrically coupled to at least one of the plurality of metal pads on the upper surface of the base layer of the bottom portion;

wherein the bottom portion, the spacer portion and the top portion cooperate with each other to form a housing having a substantially rectangular shape with an internal acoustic chamber for the MEMS microphone die, and that protects the MEMS microphone die from at least one of light, electromagnetic interference, and physical damage;

wherein a conductive material physically couples the lower surface of the spacer portion to the coupling area of the upper surface of the bottom portion such that the window of the spacer portion and the inner area of the upper surface of the bottom portion are aligned, and the metal layer on the window walls of the spacer portion is electrically coupled to the at least one metal pad positioned in the coupling area of the bottom portion;

wherein a conductive material physically couples the upper surface of the spacer portion to the coupling area of the lower surface of the top portion such that the window of the spacer portion and the inner area of the lower surface of the top portion are aligned, and the metal layer of the top portion is electrically coupled to the metal layer on the window walls of the spacer portion;

wherein electrical continuity is present between the at least one metal layer in the top portion, the metal layer on the window walls of the spacer portion, and at least one of the plurality of solder pads; and wherein the inner area of the upper surface of the bottom portion, the window walls of the spacer portion, and the inner area of the lower surface of the top portion, when attached, define the internal acoustic chamber for the MEMS microphone die.

19. A surface mount MEMS microphone according to claim 18, wherein the housing further comprises a material layer that substantially blocks environmental contaminants from entering the acoustic chamber through the acoustic port.

20. A surface mount MEMS microphone according to claim 18, wherein the acoustic port is disposed in a position offset from the centerpoint of the top portion.

21. A surface mount MEMS microphone according to claim 18, wherein the acoustic port in the top portion is a first acoustic port, and the base layer of the bottom portion further comprises a second acoustic port.

22. A surface mount MEMS microphone according to claim 21, wherein the housing further comprises a material that substantially blocks environmental contaminants from entering the acoustic chamber through one or both of the first and second acoustic ports.

23. A surface mount MEMS microphone according to claim 21, wherein an integrated circuit die is mounted in the inner area of the base layer of the bottom portion.

24. A surface mount MEMS microphone according to claim 18, wherein the at least one passive electrical element is disposed within the base layer of the bottom portion and comprises a dielectric or resistive material that is different from the printed circuit board material of the base layer.

25. A surface mount MEMS microphone according to claim 24, wherein the at least one passive electrical element filters one or more of an input signal, an output signal, or input power.

26. A surface mount MEMS microphone according to claim 18, wherein the printed circuit board layer of the spacer portion further comprises additional layers of printed circuit board material alternating with additional metal layers, and the conductive material on the window walls electrically couples the additional metal layers to each other.

27. A surface mount MEMS microphone according to claim 18, wherein the base layer of the bottom portion further comprises at least one additional non-conductive layer and at least one additional conductive layer.

28. A solder reflow surface mount micro-electro-mechanical system (MEMS) microphone, the microphone comprising:

a base substrate comprising:
a core layer comprised of at least one layer of FR-4 printed circuit board material, wherein the core layer has a substantially flat top surface and a substantially flat bottom surface, the top surface having a die mount region and an attachment region, the attachment region positioned between the die mount region and the edges of the core layer, and completely surrounding the die mount region;
a plurality of metal pads located on the top surface of the core layer, wherein at least one pad of the plurality of metal pads is located in the attachment region of the top surface of the core layer;
a plurality of solder pads located on the bottom surface of the core layer, the plurality of solder pads arranged to be within the edges of the core layer; and
a plurality of electrical connections passing through the core layer that electrically couple one or more of the plurality of metal pads on the top surface of the core layer to one or more of the plurality of solder pads on the bottom surface of the core layer, and wherein the at least one metal pad located in the attachment region of the top surface of the core layer is electrically coupled to one or more of the plurality of solder pads;

an enclosure comprising:
a first enclosure element having a substantially flat top and bottom surfaces and comprising at least two metal layers with multiple FR-4 printed circuit board material layers of predefined thickness disposed between the two metal layers, wherein one metal layer comprises the top surface of the first enclosure element and the other metal layer comprises the bottom surface of the first enclosure element;
a second enclosure element having substantially flat top and bottom surfaces and comprising at least one metal layer, at least one FR-4 printed circuit board material layer, and an acoustic port that is disposed in an offset position from the centerpoint of the second enclosure element, wherein the metal layer comprises the bottom surface of the second enclosure element, wherein the bottom surface has an attachment region and an inner region, the attachment region being arranged between the attachment region and the edges of the second enclosure element, and completely surrounding the attachment region;
a pressure-equalizing MEMS microphone die having an internal acoustic channel mounted in the inner region of the bottom surface of the second enclosure element, and electrically coupled to one or more of the metal pads on the top surface of the core layer;

wherein a conductive material physically couples the top surface of the first enclosure element to the attachment region of the bottom surface of the second enclosure element;

wherein the first enclosure element comprises an interior open volume with walls, thereby exposing the inner region of the bottom surface of the second enclosure element; and wherein the interior open volume walls have a metal layer that is electrically connected to the bottom surface metal layer of the second enclosure element;

the base substrate and the enclosure being joined together to form a housing that has an internal acoustic chamber for the MEMS microphone die, and that protects the MEMS microphone die from at least one of light, electromagnetic interference, and physical damage, wherein a conductive material physically couples the bottom surface metal layer of the first enclosure element to the attachment region of the base substrate, and wherein the interior open volume of the first enclosure element is aligned with the die mount region of the base substrate and the metal pad positioned in the attachment region is electrically coupled to the metal layer of the interior open volume walls in the first enclosure element;

wherein the interior region of the bottom surface of the second enclosure element, the interior open volume walls of the first enclosure element, and the die mount region of the base substrate define the acoustic chamber for the MEMS microphone die;

wherein electrical continuity exists between the metal layer of the second enclosure element, the metal-covered interior open volume walls of the enclosure element, and one or more of the plurality of solder pads on the base substrate; and wherein the length of the base substrate and the length of the enclosure are substantially equal, and the width of the base substrate and the width of the enclosure are substantially equal.

29. A surface mount MEMS microphone according to claim 28, further comprising at least one passive electrical element electrically coupled between one of the first plurality of metal pads and one of the second plurality of metal pads, and disposed within the core layer of the base substrate.

30. A surface mount MEMS microphone according to claim 29, wherein the at least one passive electrical element is disposed within the core layer of the base substrate and comprises a dielectric or resistive material that is different from the FR-4 printed circuit board material of the core layer.

31. A surface mount MEMS microphone according to claim 30, wherein the at least one passive electrical element filters one or more of an input signal, an output signal, or input power.

32. A surface mount MEMS microphone according to claim 28, wherein the housing further comprises a material that substantially blocks environmental contaminants from entering the acoustic chamber through the first acoustic port.

33. A surface mount MEMS microphone according to claim 28, wherein an integrated circuit die is mounted in the die mount region of the core layer of the base substrate.

34. A surface mount MEMS microphone according to claim 28, wherein an integrated circuit die is mounted in the attachment region of the core layer of the third housing element.

35. A surface mount MEMS microphone according to claim 28, wherein the first enclosure element further comprises additional metal layers alternating with the FR-4 printed circuit board material layers, and the metal layer of the interior open volume walls electrically couples the additional metal layers to each other.

36. A solder reflow surface mount micro-electro-mechanical system (MEMS) microphone, the microphone comprising:

a pressure-equalizing MEMS microphone die having an internal acoustic channel;

a housing for the MEMS microphone die comprising:

a first housing element having substantially flat top and bottom surfaces and comprising at least one metal layer, at least one printed circuit board material layer, and an acoustic port, wherein the at least one metal layer comprises the bottom surface of the first housing element, wherein the bottom surface has an attachment region and an interior region, the attachment region located between the interior region and the edges of the first housing element and completely surrounding the interior region, and wherein the acoustic port is disposed in a position offset from the centerpoint of the first housing element;

a second housing element having substantially flat top and bottom surfaces and comprising at least first and second metal layers with multiple printed circuit board material layers of predefined thickness disposed between the first and second metal layers, wherein the first metal layer comprises the top surface of the second housing element and the second metal layer comprises the bottom surface of the second housing element, wherein the second housing element further comprises an aperture having metal-covered walls, and the aperture walls extend through the printed circuit board material layer to the top and bottom surfaces of the second housing element;

a third housing element comprising:

a core layer comprised of at least one layer of printed circuit board material, wherein the core layer has a substantially flat top surface and a substantially flat bottom surface, wherein the top surface has an interior region and an attachment region, the attachment region being arranged between the interior region and the edges of the core layer, and the attachment region completely surrounds the interior region;

a plurality of metal pads disposed on the top surface of the core layer, wherein at least one pad of the plurality of metal pads is positioned in the attachment region of the top surface of the core layer;

a plurality of solder pads disposed on the bottom surface of the core layer, the plurality of solder pads arranged to be within the edges of the core layer; and one or more electrical vias located inside the core layer, wherein the vias electrically couple one or more of the plurality of metal pads on the top surface of the core layer to one or more of the plurality of solder pads on the bottom surface of the core layer, and wherein a via electrically couples the at least one metal pad positioned in the attachment region of the top surface of the core layer to one or more of the plurality of solder pads;

wherein the MEMS microphone die is physically coupled to the bottom surface of the first housing element, and electrically coupled to at least one of the plurality of metal pads on the top surface of the core layer of the third housing element;

wherein the first, second, and third housing elements cooperate with each other to form a housing, wherein the first, second, and third housing elements create side surfaces substantially perpendicular to the bottom surface of the third housing element, wherein the housing has an internal acoustic chamber for the MEMS microphone die, and wherein the housing protects the MEMS microphone die from at least one of light, electromagnetic interference, and physical damage;

wherein a conductive material physically couples the attachment region of the bottom surface of the first housing element to the top surface of the second housing element to such that the interior region of the bottom surface of the first housing element and the aperture of the second housing element are aligned, and the metal layer of the first housing element is electrically coupled to the metal-covered aperture walls of the second housing element;

wherein a conductive material physically couples the bottom surface of the second housing element to the attachment region of the top surface of the third housing element such that the aperture of the second housing element and the interior region of the top surface of the third housing element are aligned, and the metal-covered aperture walls of the second housing element are electrically coupled to the at least one metal pad positioned in the attachment region of the third housing element;

wherein the interior region of the bottom surface of the first housing element, the aperture walls of the second housing element, and the interior region of the top surface of the third housing element, when attached, define the internal acoustic chamber for the MEMS microphone die; and wherein electrical continuity exists between the metal layer of the first housing element, the metal-covered aperture walls of the second housing element, and one or more of the plurality of solder pads on the third housing element.

37. A surface mount MEMS microphone according to claim 36, further comprising at least one passive electrical element electrically coupled between one of the plurality of metal pads and one of the plurality of solder pads.

38. A surface mount MEMS microphone according to claim 37, wherein the at least one passive electrical element is disposed within the core layer of the third housing element and comprises a dielectric or resistive material that is different from the printed circuit board material of the core layer.

39. A surface mount MEMS microphone according to claim 38, wherein the at least one passive electrical element filters one or more of an input signal, an output signal, or input power.

40. A surface mount MEMS microphone according to claim 36, wherein the housing further comprises a material layer that substantially blocks environmental contaminants from entering the acoustic chamber through the acoustic port.

41. A surface mount MEMS microphone according to claim 36, wherein the acoustic port in the first housing element is a first acoustic port, and the core layer of the third housing element further comprises a second acoustic port.

42. A surface mount MEMS microphone according to claim 41, wherein the housing further comprises a material that substantially blocks environmental contaminants from entering the acoustic chamber through one or both of the first and second acoustic ports.

43. A surface mount MEMS microphone according to claim 36, wherein the second housing element further comprises additional metal layers interposed between the multiple layers of printed circuit board material, and the metal-covered walls of the aperture electrically couples the additional metal layers to each other.

\* \* \* \* \*